(12) United States Patent
Hwang et al.

(10) Patent No.: US 11,373,718 B2
(45) Date of Patent: Jun. 28, 2022

(54) MEMORY DEVICE AND METHOD OF OPERATING THE SAME

(71) Applicant: SK hynix Inc., Gyeonggi-do (KR)

(72) Inventors: Sung Hyun Hwang, Gyeonggi-do (KR); Jin Haeng Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/161,295

(22) Filed: Jan. 28, 2021

(65) Prior Publication Data

US 2022/0051739 A1 Feb. 17, 2022

(30) Foreign Application Priority Data

Aug. 14, 2020 (KR) .................. 10-2020-0102745

(51) Int. Cl.
*G11C 16/34* (2006.01)
*G11C 16/14* (2006.01)
*G11C 16/30* (2006.01)
*G11C 11/56* (2006.01)
*G11C 16/10* (2006.01)
*G11C 16/04* (2006.01)

(52) U.S. Cl.
CPC .......... *G11C 16/3459* (2013.01); *G11C 11/56* (2013.01); *G11C 16/10* (2013.01); *G11C 16/14* (2013.01); *G11C 16/30* (2013.01); *G11C 16/0483* (2013.01)

(58) Field of Classification Search
CPC .................................................. G11C 16/3445
USPC .................................................... 365/185.29
See application file for complete search history.

(56) References Cited

U.S. PATENT DOCUMENTS 9,754,672 B2 * 9/2017 Nakai ................ G11C 16/3445

FOREIGN PATENT DOCUMENTS

KR 10-1676816 11/2016
KR 10-2017-0059643 5/2017

* cited by examiner

*Primary Examiner* — Jason Lappas
(74) *Attorney, Agent, or Firm* — IP & T Group LLP

(57) ABSTRACT

Provided herein may be a memory device and a method of operating the same. The memory device may include a plurality of memory cells, each having an erased state or any one of a plurality of program states, a peripheral circuit configured to perform a program operation including a plurality of program loops, and an operation controller configured to control the peripheral circuit so that, in response to a pass in verification for an N-th program state among the plurality of program states in a verify phase included in an x-th program loop among the plurality of program loops, verification for an N+M-th program state among the plurality of program states starts in a verify phase included in an x+1-th program loop among the plurality of program loops.

18 Claims, 14 Drawing Sheets

311a

| WL | M at N+M PV |
|---|---|
| WL1 | M=2 |
| WL2 | M=2 |
| WL3 | M=3 |
| WL4 | M=3 |
| ⋮ | ⋮ |
| WLn | M=4 |

| Number of On-cell at Vcheck | Offset Program Loop |
|---|---|
| x1 | 1 |
| x2(>x1) | 2 |
| x3(>x2) | 3 |
| ⋮ | ⋮ |

312

MEMORY DEVICE AND METHOD OF OPERATING THE SAME

CROSS-REFERENCE TO RELATED APPLICATION

The present application claims priority under 35 U.S.C. § 119(a) to Korean patent application number 10-2020-0102745, filed on Aug. 14, 2020, which is incorporated herein by reference in its entirety.

BACKGROUND

1. Field of Invention

Various embodiments of the present disclosure generally relate to an electronic device, and more particularly to a memory device and a method of operating the memory device.

2. Description of Related Art

A storage device stores data under the control of a host. A storage device may include a memory device which stores data and a memory controller which controls the memory device. Generally, there are two types of memory devices: volatile memory devices and nonvolatile memory devices.

A volatile memory device may store data only while power is supplied from a power source. When the supply of power is interrupted, data stored in the volatile memory device may be lost. Examples of volatile memory devices include a static random access memory (SRAM) and a dynamic random access memory (DRAM).

In a nonvolatile memory device, stored data is retained even when the supply of power from a power source is interrupted. Examples of nonvolatile memory devices include a read only memory (ROM), a programmable ROM (PROM), an electrically programmable ROM (EPROM), an electrically erasable and programmable ROM (EEPROM), and a flash memory.

SUMMARY

Various embodiments of the present disclosure are directed to a memory device that improves device performance by reducing program operation time, and a method of operating the memory device.

An embodiment of the present disclosure may provide for a memory device. The memory device may include a memory block including a plurality of memory cells, each having an erased state or any one of a plurality of program states including first to p-th program states as a target state, where p is a natural number greater than 1, a peripheral circuit configured to perform a program operation including a plurality of program loops, each of which includes a program voltage apply phase and a verify phase, wherein the program voltage apply phase is configured to apply a program voltage to a selected word line coupled in common to the plurality of memory cells among a plurality of word lines coupled to the memory block, and the verify phase is configured to determine whether each of threshold voltages of the plurality of memory cells has reached a threshold voltage corresponding to the target state, and an operation controller configured to control the peripheral circuit so that, in response to a pass in verification for an N-th program state among the plurality of program states in the verify phase in an x-th program loop among the plurality of program loops, verification for an N+M-th program state among the plurality of program states starts in the verify phase in an x+1-th program loop among the plurality of program loops, where x is a natural number, N is a natural number that is equal to or greater than 1 and less than or equal to p−2, and M is a natural number equal to or greater than 2.

An embodiment of the present disclosure may provide for a memory device. The memory device may include a memory block including a plurality of memory cells, each having an erased state or any one of a plurality of program states including first to p-th program states as a target state, where p is a natural number greater than 1, a peripheral circuit configured to perform a program operation including a plurality of program loops, each of which includes a program voltage apply phase and a verify phase, wherein the program voltage apply phase is configured to apply a program voltage to a selected word line coupled in common to the plurality of memory cells, among a plurality of word lines coupled to the memory block, and the verify phase is configured to determine whether each of threshold voltages of the plurality of memory cells has reached a threshold voltage corresponding to the target state, and an operation controller configured to control the peripheral circuit so that, in response to a pass in verification for an N-th program state among the plurality of program states in the verify phase included in an x-th program loop among the plurality of program loops, verification for an N+2-th program state among the plurality of program states starts in the verify phase included in an x+y-th program loop among the plurality of program loops, where x is a natural number, N is a natural number that is equal to or greater than 1 and less than or equal to p−2, and y is a natural number equal to or greater than 1.

An embodiment of the present disclosure may provide for a method of operating a memory device, the memory device programming a plurality of memory cells to an erased state or any one of a plurality of program states including first to p-th program states, where p is a natural number greater than 1. The method may include applying, in an x-th program loop, a program voltage to a selected word line coupled in common to the plurality of memory cells among a plurality of word lines, where x is a natural number, verifying, in the x-th program loop, whether each of threshold voltages of memory cells to be programmed to an N-th program state, among the plurality of memory cells, has reached a threshold voltage corresponding to the N-th program state, where N is a natural number that is equal to or greater than 1 and less than or equal to p−2, applying, in an x+y-th program loop, a program voltage higher than the program voltage applied in the x-th program loop, where y is a natural number equal to or greater than 1, and starting, in the x+y-th program loop, verification for an N+M program state in response to a pass in verification for the N-th program state, where M is a natural number equal to or greater than 2.

An embodiment of the present disclosure may provide for a memory device. The memory device may include memory cells coupled to a word line, and a control circuit configured to perform, when an N-th program state passes verification during an X-th program loop on the memory cells, a verify operation for an (N+M)-th program state during an (X+Y)-th program loop on the memory cells. the control circuit performs the verify operation by determining M to be 2 or greater based on disposition of the word line within the memory device, and determining Y to be 1 or greater based on a number of on-cells with reference to a check voltage level between verify voltage levels for the N-th and (N+1)-th program states. N is between 1 and (P−2), and P represents a number of program states of each of the memory cells.

DETAILED DESCRIPTION

Specific structural and functional description is presented herein to describe embodiments of the present disclosure. The invention, however, may be practiced in various forms, and thus should not be construed as being limited to the disclosed embodiments. Throughout the specification, reference to "an embodiment" or the like is not necessarily to only one embodiment, and different references to any such phrase are not necessarily to the same embodiment(s).

Figure 1:
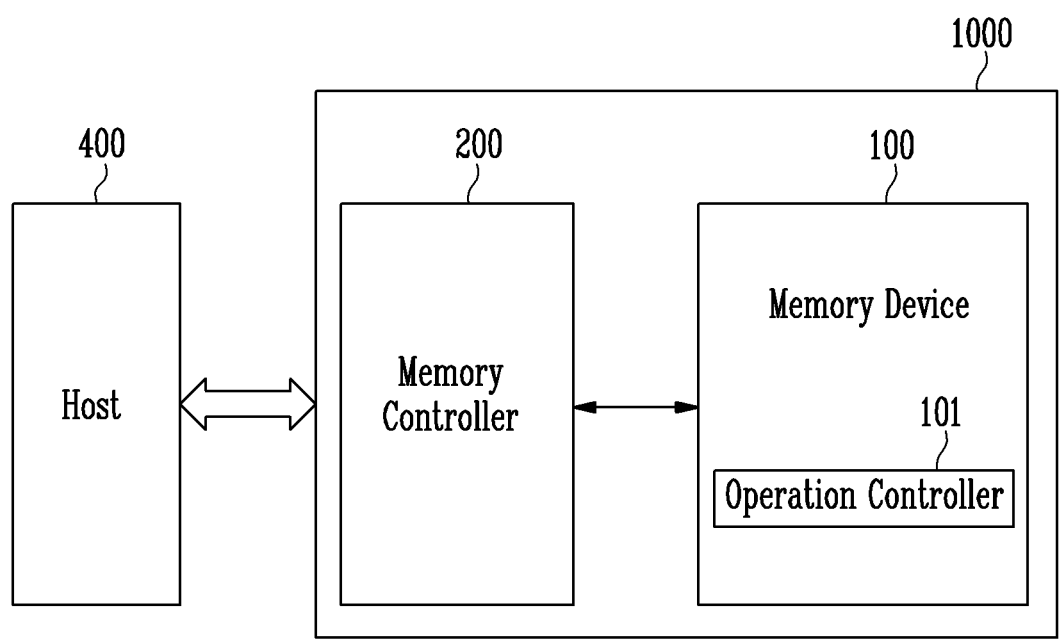
FIG. 1 is a diagram illustrating a storage system according to an embodiment of the present disclosure.

FIG. 1 is a diagram illustrating a storage system according to an embodiment of the present disclosure.

Referring to FIG. 1, the storage system may be implemented as a personal computer (PC), a data center, an enterprise data storage system, a data processing system including a direct attached storage (DAS), a data processing system including a storage area network (SAN), or a data processing system including a network attached storage (NAS).

The storage system may include a storage device 1000 and a host 400.

The storage device 1000 may store data in response to a request received from the host 400, such as a mobile phone, a smartphone, an MP3 player, a laptop computer, a desktop computer, a game console, a TV, a tablet PC, or an in-vehicle infotainment system.

The storage device 1000 may be manufactured or configured as any of various types of storage devices depending on a host interface that sets a scheme for communication with the host 400. For example, the storage device 1000 may be implemented as a solid state disk (SSD), a multimedia card such as an MMC, an embedded MMC (eMMC), a reduced size MMC (RS-MMC), or a micro-MMC, a secure digital card such as an SD, a mini-SD, or a micro-SD, a universal serial bus (USB) storage device, a universal flash storage (UFS) device, a personal computer memory card international association (PCMCIA) card-type storage device, a peripheral component interconnect (PCI)-card type storage device, a PCI express (PCI-E) card-type storage device, a compact flash (CF) card, a smart media card, and/or a memory stick.

The storage device 1000 may be manufactured in any of various types of package forms. For example, the storage device 1000 may be manufactured as package on package (POP), system in package (SIP), system on chip (SOC), multi-chip package (MCP), chip on board (COB), wafer-level fabricated package (WFP), and/or wafer-level stack package (WSP).

The storage device 1000 may include a memory device 100 and a memory controller 200.

The memory device 100 may be operated in response to the control of the memory controller 200. In detail, the memory device 100 may receive a command and an address from the memory controller 200, and may access a memory cell selected from among memory cells (not illustrated) by the address. The memory device 100 may perform an operation indicated by the command on the memory cell selected by the address.

The command may be, for example, a program command, a read command or an erase command, and the operation indicated by the command may be, for example, a program operation (or a write operation), a read operation or an erase operation.

For example, the memory device 100 may receive a program command, an address, and data, and may program the data to the memory cell selected by the address. Here, the data to be programmed to the selected memory cell may be defined as write data.

For example, the memory device 100 may receive a read command and an address, and may read data from the area of a memory cell array (not illustrated), selected by the address. Among pieces of data stored in the memory device 100, data to be read from the selected area may be defined as read data.

For example, the memory device 100 may receive an erase command and an address, and may erase data stored in the area selected by the address.

In an embodiment, the memory device 100 may be implemented as a double data rate synchronous dynamic random access memory (DDR SDRAM), a low power double data rate fourth generation (LPDDR4) SDRAM, a graphics double data rate (GDDR) SDRAM, a low power DDR (LPDDR) SDRAM, a Rambus dynamic random access memory (RDRAM), a NAND flash memory, a vertical NAND flash memory, a NOR flash memory device, a resistive RAM (RRAM), a phase-change memory (PRAM), a magnetoresistive RAM (MRAM), a ferroelectric RAM (FRAM), or a spin transfer torque RAM (STT-RAM).

In the present specification, by way of example, it is assumed that the memory device 100 is a NAND flash memory.

The memory device 100 may store the write data, or may read the stored read data and provide the read data to the memory controller 200, under the control of the memory controller 200.

The memory device 100 may include at least one plane. A single plane may include a memory cell array including memory cells which store write data.

The memory cell array may include a plurality of memory blocks (not illustrated). A memory block may be a unit on which an operation of erasing data is performed.

Each memory block may include a plurality of pages (not illustrated). A page may be a unit on which a program operation of storing write data or a read operation of reading stored read data is performed.

Each memory block may include a plurality of memory cells. Each of the memory cells may have an erased state or any one of a plurality of program states as a target state thereof depending on whether the program operation has been performed. That is, one memory cell may be in an erased state or any one of the plurality of program states.

The program operation may include increasing threshold voltages of memory cells selected from among the plurality of memory cells so that the threshold voltages of the selected memory cells are included in respective target states. The program operation may be performed on a page basis. A page may indicate a plurality of memory cells coupled to the same word line.

The number of possible program states may be determined according to the number of data bits stored in each memory cell. For example, each memory cell may be implemented as any one of a single-level cell (SLC) that stores one bit of data, a multi-level cell (MLC) that stores two bits of data, a triple-level cell (TLC) that stores three bits of data, and a quad-level cell (QLC) that stores four bits of data. However, the number of bits that one cell may store, and hence the number of program states that such cell may have, is not limited to the above examples; in general, each memory cell may store any suitable number of bits of data including five or more bits of data.

An SLC may be in an erased state or a first program state, and thus the number of program states is 1. An MLC may be in an erased state or any one of first to third program states, and thus the number of program states is 3. For a TLC, the number of program states is 7, and for a QLC, the number of program states is 15. That is, the number of program states of a memory cell that stores a bits of data may be p, where a is a natural number. Here, p is $2^a-1$.

The target state to which the memory cell is to be programmed may be determined depending on the data to be stored in the corresponding memory cell. In an SLC, the target state may be any one of an erased state and a first program state. In an MLC, the target state may be an erased state or any one of first to third program states. In a TLC, the target state may be an erased state or any one of first to seventh program states. In a QLC, the target state may be an erased state or any one of first to fifteenth program states.

A program operation may include a plurality of program loops. Each program loop may include a program voltage apply operation and a verify operation.

The program voltage apply operation may include applying a program voltage to a selected word line that is coupled in common to selected memory cells. In the present specification, the term "program voltage apply operation" and the term "program voltage apply phase" may have the same meaning.

The verify operation may include determining whether the threshold voltage of each memory cell has reached a threshold voltage corresponding to a target state. In the present specification, the term "verify operation" and the term "verify phase" may have the same meaning.

During the verify operation, a verify voltage for verifying the target state may be applied to the selected word line. When threshold voltages of a set number of memory cells, among memory cells having the same target state, are higher than the verify voltage, the memory cells may pass the verify operation with respect to that target state. When the threshold voltages of a set number of memory cells, among memory cells having the same target state, are lower than or equal to the verify voltage, the memory cells may fail in the verify operation.

When verification for all target states has passed, the program operation may be determined to have passed. When the program operation has not passed within a set reference time, the program operation may be determined to have failed. Alternatively, when the program operation has not passed after a maximum number of program loops have been executed (set as a maximum loop count), the program operation may be determined to have failed.

The memory device 100 may include an operation controller 101.

In an embodiment, when verification for an N-th program state has passed in a verify phase in an x-th program loop, the operation controller 101 may perform a control operation of starting verification for an N+M-th program state in a verify phase in an x+1-th program loop in response to the verification pass. Here, x is a natural number, N is a natural number that is equal to or greater than 1 and is less than or equal to p−2, and M is a natural number equal to or greater than 2.

In an embodiment, when verification for the N-th program state has passed in the verify phase in the x-th program loop, the operation controller 101 may perform a control operation of starting verification for an N+2-th program state in a verify phase in an x+y-th program loop in response to the verification pass. Here, x is a natural number, y is a natural number equal to or greater than 1, N is a natural number that is equal to or greater than 1 and is less than or equal to p−2, and M is a natural number equal to or greater than 2.

More detail about the operation controller 101 is given below with reference to FIGS. 2 and 7.

The memory controller 200 may control overall operation of the storage device 1000.

When power is applied to the storage device 1000, the memory controller 200 may run firmware (FW). When the memory device 100 is a flash memory device, the firmware may include a host interface layer, a flash translation layer, and a flash interface layer.

The host interface layer may control an operation between the host 400 and the memory controller 200.

The flash translation layer may translate a logical address provided from the host 400 into a physical address. For this operation, the memory controller 200 may store map data indicating corresponding relationships between logical addresses and physical addresses.

The flash interface layer may control communication between the memory controller 200 and the memory device 100.

The memory controller 200 may control the memory device 100 so that a program operation, a read operation, and an erase operation are respectively performed in response to a write request, a read request, and an erase request received from the host 400.

During a program operation, the memory controller 200 may provide a program command, a physical address, and write data to the memory device 100.

During a read operation, the memory controller 200 may provide a read command and a physical address to the memory device 100.

During an erase operation, the memory controller 200 may provide an erase command and a physical address to the memory device 100.

The memory controller 200 may autonomously generate a command, an address, and data in the absence of a request provided from the host 400. The memory controller 200 may transmit the autonomously generated command, address, and data to the memory device 100.

For example, the memory controller 200 may autonomously generate a command, an address, and data to perform a background operation. Further, the memory controller 200 may transmit the command, address, and data to the memory device 100.

The background operation may be any of a wear leveling operation, a read reclaim operation, and a garbage collection operation.

Wear leveling may mean, for example, static wear leveling, dynamic wear leveling, etc. Static wear leveling may include storing the numbers of erase operations performed on memory blocks as respective erase operation counts and moving cold data for which an erase operation or a write operation is rarely performed to a memory block having the greatest erase operation count. Dynamic wear leveling operation may include storing the numbers of erase operations performed on memory blocks and programming data to a memory block having the lowest erase operation count.

The read reclaim operation may include moving data stored in a memory block to another memory block before uncorrectable error occurs in the data stored in the memory block.

The garbage collection operation may include copying valid data in a bad block, among memory blocks, and moving such data to a free block and erasing invalid data in the bad block.

The memory controller 200 may provide the host 400 with a response to a request received from the host 400, and may wait until a subsequent request to be provided by the host 400 is received after providing the response.

The memory controller 200 may control two or more memory devices 100. In this case, the memory controller 200 may control the memory devices 100 based on an interleaving scheme to improve operation performance.

The interleaving scheme may include controlling the memory devices 100 so that the operations of two or more memory devices 100 overlap each other.

Although not illustrated in the drawing, the storage device 1000 may further include a buffer memory. In an embodiment, the buffer memory may be implemented as any of a double data rate synchronous dynamic random access memory (DDR SDRAM), a low power double data rate fourth generation (LPDDR4) SDRAM, a graphics double data rate (GDDR) SDRAM, a low power DDR (LPDDR) SDRAM, a Rambus dynamic random access memory (RDRAM), a resistive RAM (RRAM), a phase-change memory (PRAM), a magnetoresistive RAM (MRAM), a ferroelectric RAM (FRAM), or a spin transfer torque RAM (STT-RAM).

The host 400 may communicate with the storage device 1000 through an interface (not illustrated).

The interface may be implemented as a serial advanced technology attachment (SATA) interface, a SATA express (SATAe) interface, a serial attached small computer system interface (SAS), a peripheral component interconnect express (PCIe) interface, a non-volatile memory Express (NVMe) interface, an advanced host controller interface (AHCI) interface, or a multimedia card interface. However, the present disclosure is not limited to any particular interface.

The host 400 may communicate with the storage device 1000 so as to store write data in the storage device 1000 or acquire read data stored in the storage device 1000.

In an embodiment, the host 400 may provide the storage device 1000 with a write request that requests the storage device 1000 to store the write data. Further, the host 400 may provide the write request, the write data, and a logical address for identifying the write data to the storage device 1000.

The storage device 1000 may store the write data provided from the host 400 in the memory device 100 in response to the write request provided from the host 400, and may provide a response to the host 400 indicating that storage has been completed.

In an embodiment, the host 400 may provide the storage device 1000 with a read request that requests the storage device 1000 to provide the data stored in the storage device 1000 to the host 400. Also, the host 400 may provide the read request and a read address to the storage device 1000.

The storage device 1000 may read, from the memory device 100, read data corresponding to the read address provided from the host 400 in response to the read request provided from the host 400, and may provide the read data to the host 400 as a response to the read request.

Figure 2:
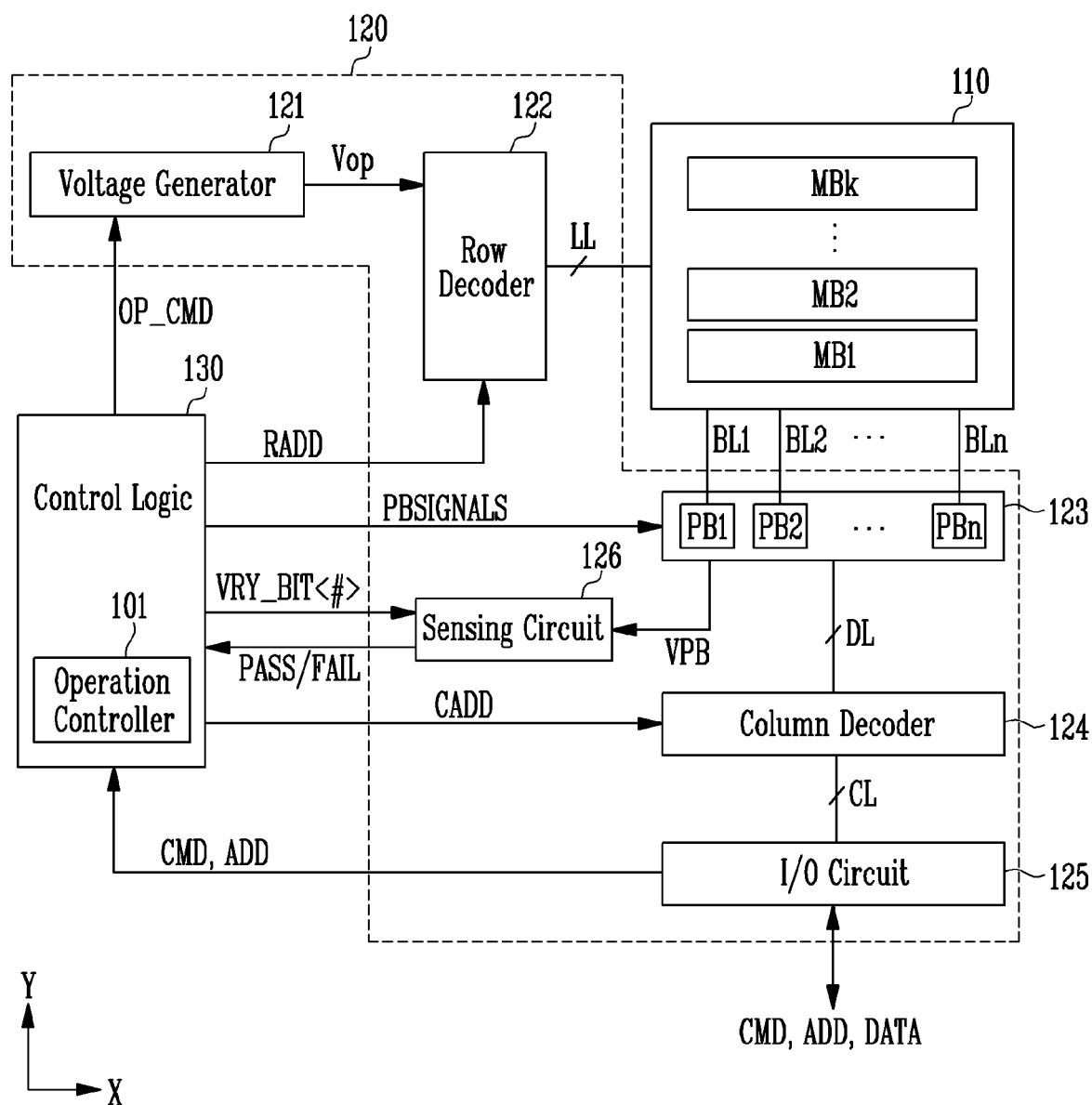
FIG. 2 is a diagram illustrating a memory device according to an embodiment of the present disclosure.

FIG. 2 is a diagram illustrating a memory device according to an embodiment of the present disclosure.

Referring to FIGS. 1 and 2, the memory device 100 may include a memory cell array 110, a peripheral circuit 120, and control logic 130.

The memory cell array 110 may include a plurality of memory blocks MB1 to MBk (where k is a positive integer of 2 or more).

Each of the memory blocks MB1 to MBk may be coupled to local lines LL and bit lines BL1 to BLn (where n is a positive integer of 2 or more).

The local lines LL may be coupled to a row decoder 122.

The local lines LL may be coupled to each of the memory blocks MB1 to MBk.

Although not illustrated in the drawing, the local lines LL may include a first select line, a second select line, and a plurality of word lines arranged between the first and second select lines.

Although not illustrated in the drawing, the local lines LL may further include dummy lines arranged between the first select line and the word lines, dummy lines arranged between the second select line and the word lines, and pipelines.

The bit lines BL1 to BLn may be coupled in common to the memory blocks MB1 to MBk.

The memory blocks MB1 to MBk may be implemented in a two-dimensional (2D) or three-dimensional (3D) structure.

For example, memory cells in the memory blocks MB1 to MBk having a 2D structure may be horizontally arranged on a substrate.

For example, memory cells in the memory blocks MB1 to MBk having a 3D structure may be vertically stacked on the substrate.

The peripheral circuit 120 may perform a program operation, which may include a plurality of program loops. Each program loop may include a program voltage apply phase and a verify phase. The program voltage apply phase may include applying a program voltage to a selected word line which is coupled in common to a plurality of selected memory cells, among a plurality of word lines coupled to a memory block (any one of MB1 to MBk). The verify phase may include determining whether threshold voltages of the plurality of selected memory cells have reached threshold voltages corresponding to respective target states.

The peripheral circuit 120 may include a voltage generator 121, a row decoder 122, a page buffer group 123, a column decoder 124, an input/output (I/O) circuit 125, and a sensing circuit 126.

The voltage generator 121 may generate various operating voltages Vop for a program operation, a read operation, and an erase operation in response to an operation command OP_CMD. Further, the voltage generator 121 may selectively discharge the local lines LL in response to the operation command OP_CMD. For example, the voltage generator 121 may generate a program voltage, a verify voltage, pass voltages, a turn-on voltage, a read voltage, an erase voltage, a source line voltage, etc. under the control of the control logic 130.

In an embodiment, the voltage generator 121 may generate a program voltage in the program voltage apply phase. Further, the voltage generator 121 may generate a verify voltage in the verify phase.

In an embodiment, the voltage generator 121 may generate an internal supply voltage by regulating an external supply voltage. The internal supply voltage generated by the voltage generator 121 may be used as an operating voltage for the memory device 100.

In an embodiment, the voltage generator 121 may generate a plurality of voltages using the external supply voltage or the internal supply voltage. For example, the voltage generator 121 may include a plurality of pumping capacitors for receiving the internal supply voltage, and may generate a plurality of voltages by selectively enabling the plurality of pumping capacitors under the control of the control logic 130. The generated voltages may be supplied to the memory cell array 110 by the row decoder 122.

In an embodiment, the voltage generator 121 may generate a check voltage (not illustrated) in response to the operation command OP_CMD.

The check voltage may be for detecting the threshold voltage distribution of memory cells selected from among the plurality of memory cells. The check voltage may be preset based on design, experiment or the like before the corresponding product is shipped. The check voltage may be applied to a selected word line coupled to the selected memory cells when verification for a specific program state has passed. In this case, in order to prevent an increase in the time it takes to perform the program operation due to use of the check voltage, the check voltage may be applied once when verification for a first program state has passed. However, the present disclosure is not limited thereto. A detailed description thereof is given below with reference to FIG. 12.

The row decoder 122 may transfer the operating voltages Vop to the local lines LL in response to a row address RADD. The operating voltages Vop may be transferred to a selected memory block (any of MB1 to MBk) through the local lines LL.

For example, during a program operation, the row decoder 122 may apply a program voltage to a selected word line and apply a program pass voltage having a level lower than that of the program voltage to unselected word lines. During a program verify operation, the row decoder 122 may apply a verify voltage to a selected word line and apply a verify pass voltage higher than the verify voltage to unselected word lines.

During a read operation, the row decoder 122 may apply a read voltage to a selected word line and apply a read pass voltage higher than the read voltage to unselected word lines.

During an erase operation, the row decoder 122 may select one memory block according to a decoded address. During the erase operation, the row decoder 122 may apply a ground voltage to word lines coupled to the selected memory block.

The page buffer group 123 may include first to n-th page buffers PB1 to PBn, which may be coupled to the memory cell array 110 through the first to n-th bit lines BL1 to BLn, respectively. The first to n-th page buffers PB1 to PBn may be operated under the control of the control logic 130.

In detail, the first to n-th page buffers PB1 to PBn may be operated in response to page buffer control signals PBSIGNALS. For example, the first to n-th page buffers PB1 to PBn may temporarily store data received through the first to n-th bit lines BL1 to BLn, or may sense voltages or currents of the bit lines BL1 to BLn during a read or verify operation.

In a program voltage apply phase, when the program voltage is applied to the selected word line, the first to n-th page buffers PB1 to PBn may transfer data DATA (or write data), received through the column decoder 124 and the input/output circuit 125, to selected memory cells through the first to n-th bit lines BL1 to BLn. The memory cells in the selected page are programmed based on the received data DATA. Memory cells coupled to a bit line to which a program permission voltage (e.g., a ground voltage) is applied may have increased threshold voltages. The threshold voltages of memory cells coupled to a bit line to which a program inhibition voltage (for example, a supply voltage) is applied may be maintained.

In a verify phase, the first to n-th page buffers PB1 to PBn may sense data stored in the selected memory cells through the first to n-th bit lines BL1 to BLn. The data stored in the selected memory cells may be provided to the first to n-th page buffers PB1 to PBn in the form of sensing currents of the selected memory cells.

In the verify phase, the first to n-th page buffers PB1 to PBn may sense whether respective threshold voltages of the plurality of memory cells are greater than the verify voltage through the first to n-th bit lines BL1 to BLn.

During a read operation, the first to n-th page buffers PB1 to PBn may sense data DATA from the memory cells in the selected page through the first to n-th bit lines BL1 to BLn, and may output the sensed data DATA to the input/output circuit 125 under the control of the column decoder 124.

During an erase operation, the first to n-th page buffers PB1 to PBn may allow the first to n-th bit lines BL1 to BLn to float.

The column decoder 124 may transfer data between the input/output circuit 125 and the page buffer group 123 in response to a column address CADD. For example, the column decoder 124 may exchange data with the page buffers PB1 to PBn through data lines DL, or may exchange data with the input/output circuit 125 through column lines CL.

The input/output circuit 125 may transfer a command CMD and an address ADD, received from the memory controller 200, to the control logic 130, or may exchange the data DATA with the column decoder 124.

During a read operation or a verify operation, the sensing circuit 126 may generate a reference current in response to an enable bit VRY_BIT<#>, and may compare a sensing voltage VPB, received from the page buffer group 123, with a reference voltage generated by the reference current and output a pass signal PASS or a fail signal FAIL. Here, the pass signal PASS may indicate that verification for any one of a plurality of program states has passed. The fail signal FAIL may indicate that verification for any one of a plurality of program states has failed.

In an embodiment, in the verify phase, the sensing circuit 126 may determine whether verification for each of the plurality of program states has passed based on a sensing current, corresponding to the sensing voltage VPB received from the page buffer group 123, and a reference current, and may output a pass signal PASS or a fail signal FAIL based on the result of the determination.

In detail, in the verify phase, when the sensing current is less than the reference current, it may be determined that each of the selected memory cells is programmed to a specific program state corresponding to the target state. Therefore, the sensing circuit 126 may determine that verification for the specific program state has passed, and may output a pass signal PASS corresponding to the determination. In the verify phase, when the sensing current is equal to or greater than the reference current, the sensing circuit 126 may determine that verification for the specific program state has failed, and may output a fail signal FAIL corresponding to the determination.

The control logic 130 may output the operation command OP_CMD, the row address RADD, the page buffer control signals PBSIGNALS, and the enable bit VRY_BIT<#> in response to the command CMD and the address ADD, and may then control the peripheral circuit 120. The control logic 300 may be implemented as hardware, software, or a combination of hardware and software. For example, the control logic 300 may be a control circuit operating in accordance with an algorithm and/or a processor executing control logic code.

The control logic 130 may include the operation controller 101 illustrated in FIG. 1. A detailed description thereof is given below with reference to FIG. 7.

Figure 3:
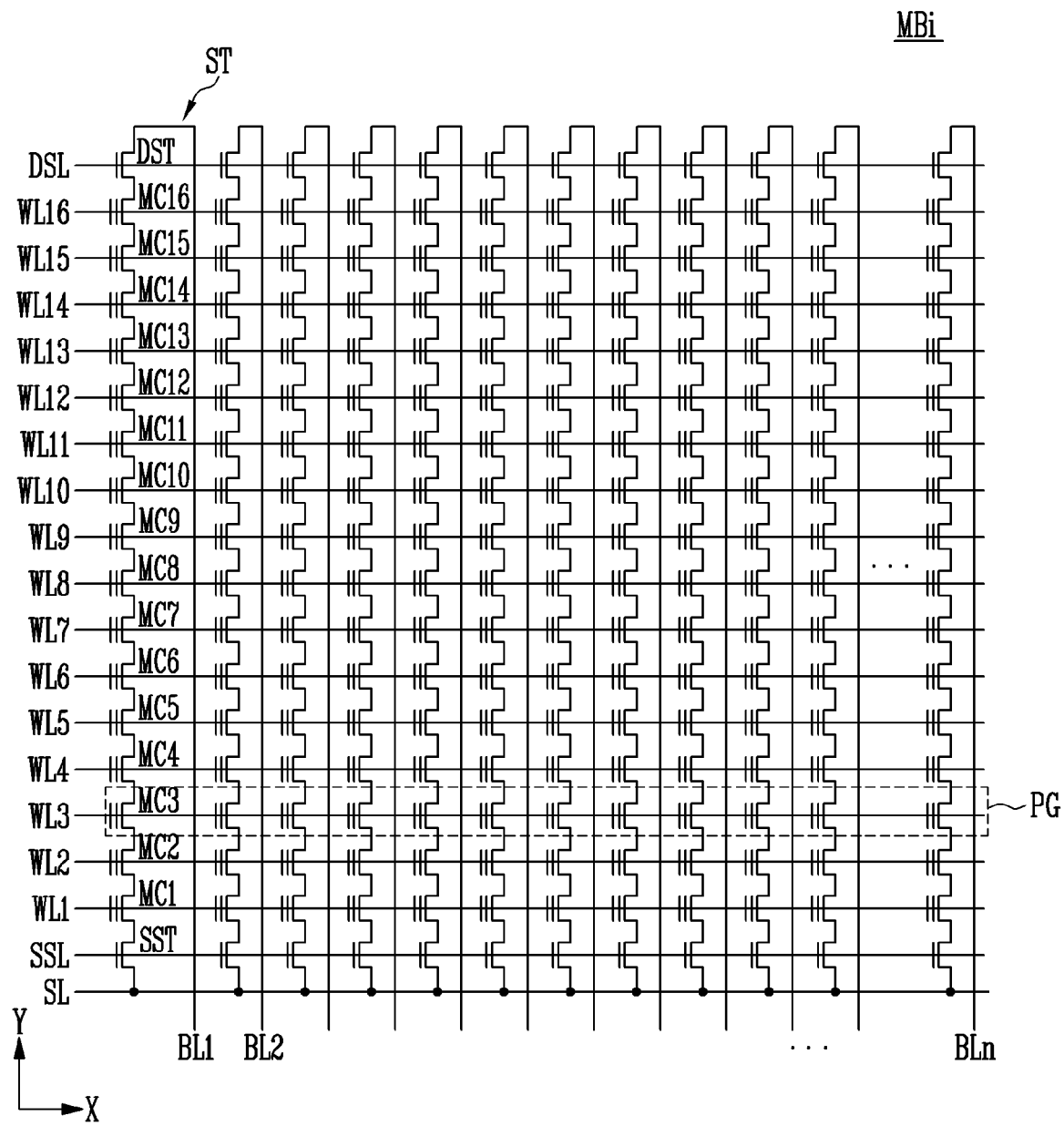
FIG. 3 is a diagram illustrating an exemplary structure of any one of a plurality of memory blocks of FIG. 2.

FIG. 3 is a diagram illustrating an exemplary structure of any one of a plurality of memory blocks of FIG. 2.

Referring to FIG. 3, a memory block MB1 illustrated in FIG. 3 is representative of any of the memory blocks MB1 to MBk of FIG. 2.

The memory block MBi may include a first select line, a second select line, a plurality of word lines WL1 to WL16, a source line SL, a plurality of bit lines BL1 to BLn, and a plurality of strings ST.

The first select line may be, for example, a source select line SSL, as is assumed in the description below.

The second select line may be, for example, a drain select line DSL, as is assumed in the description below.

The plurality of word lines WL1 to WL16 may be arranged in parallel between the source select line SSL and the drain select line DSL.

The sixteen (16) word lines WL1 to WL16 illustrated in FIG. 3 is exemplary and the present invention is not limited thereto; each memory block may have any suitable number of word lines.

The source line SL may be coupled in common to the plurality of strings ST.

The plurality of bit lines BL1 to BLn may be coupled to the strings ST, respectively.

The plurality of strings ST may be coupled to the bit lines BL1 to BLn and the source line SL.

Since the strings ST may be equally configured, a string ST coupled to the first bit line BL1 will be described in detail by way of example.

The string ST may include a plurality of memory cells MC1 to MC16, at least one first select transistor, and at least one second select transistor.

The memory cells MC1 to MC16 may be coupled in series to each other between a source select transistor SST and a drain select transistor DST.

Gates of the memory cells MC1 to MC16 may be respectively coupled to the word lines WL1 to WL16. Therefore, the number of memory cells MC1 to MC16 included in one string ST may be equal to the number of word lines WL1 to WL16.

Among the plurality of memory cells MC1 to MC16, any one memory cell may be implemented as, for example, an SLC, an MLC, a TLC, or a QLC.

A group of memory cells coupled to the same word line, among the memory cells included in different strings ST, may be referred to as a 'physical page (PG)'. Therefore, the memory block MBi may include a number of physical pages (PG) identical to the number of word lines WL1 to WL16. Hereinafter, it is assumed that memory cells (e.g., MC3) included in a physical page (PG) are selected memory cells.

The first select transistor may be, for example, the source select transistor SST, as is assumed in the description below.

A first electrode of the source select transistor SST may be coupled to the source line SL. A second electrode of the source select transistor SST may be coupled to the first memory cell MC1, among the plurality of memory cells MC1 to MC16. A gate electrode of the source select transistor SST may be coupled to the source select line SSL.

The second select transistor may be, for example, the drain select transistor DST, as is assumed in the description below.

A first electrode of the drain select transistor DST may be coupled to the sixteenth memory cell MC16, among the plurality of memory cells MC1 to MC16. A second electrode of the drain select transistor DST may be coupled to the first bit line BL1. A gate electrode of the drain select transistor DST may be coupled to the drain select line DSL.

Figure 4:
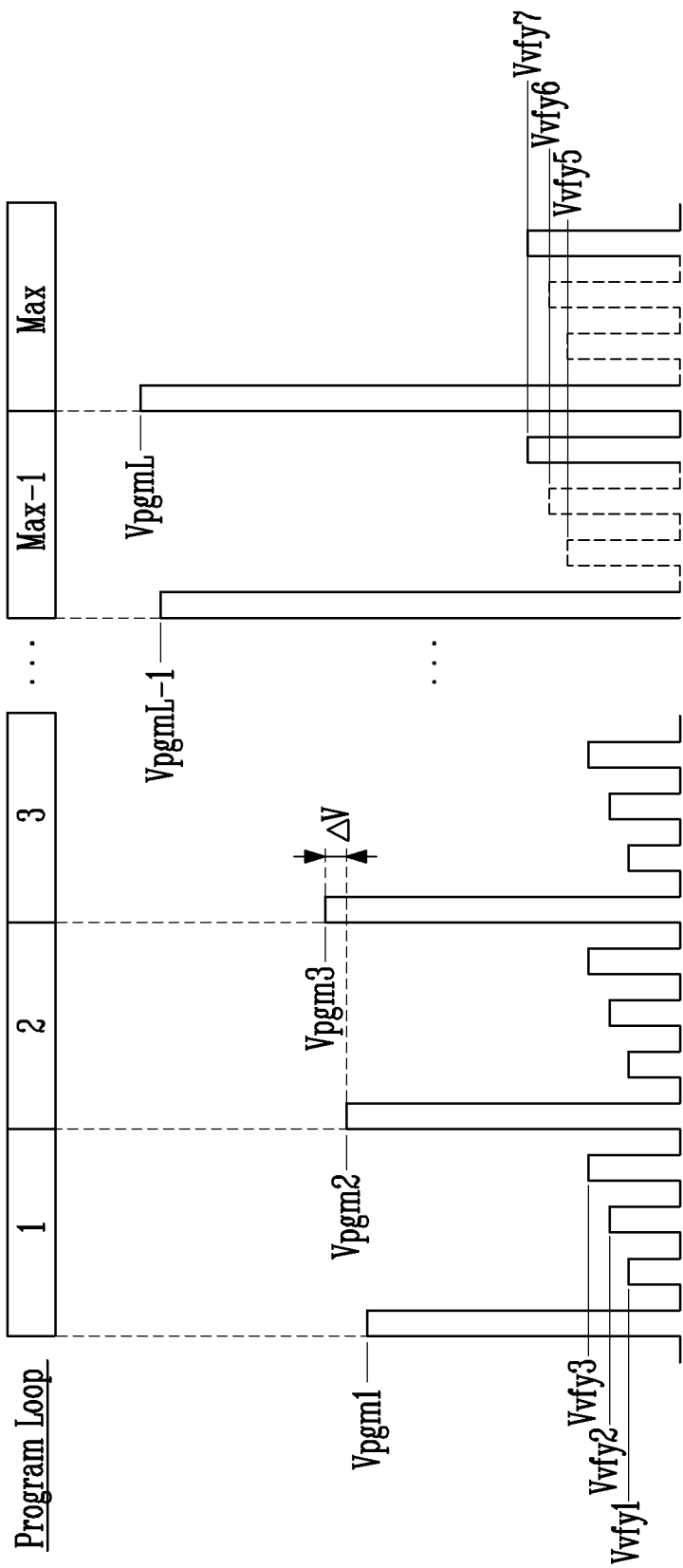
FIG. 4 is a diagram illustrating a program operation according to an embodiment of the present disclosure.

FIG. 4 is a diagram illustrating a program operation according to an embodiment of the present disclosure.

In the embodiment illustrated in FIG. 4, each of selected memory cells is assumed to be a TLC which stores three bits of data.

Referring to FIG. 4, a program operation may include a plurality of program loops, each of which may be identified by a loop count, e.g., 1 for the first program loop, 2 for the second program loop, etc.

Each program loop may include a program voltage apply phase and a verify phase.

For example, the first program loop may include a first program voltage apply phase of applying a first program voltage Vpgm1 and a first verify phase of sequentially applying first to third verify voltages Vvfy1 to Vvfy3. For example, the second program loop may include a second program voltage apply phase of applying a second program voltage Vpgm2 and a second verify phase of sequentially applying the first to third verify voltages Vvfy1 to Vvfy3. For example, a Max-1-th program loop may include an L-1-th program voltage apply phase of applying an L-1-th program voltage VpgmL-1 and an L-1-th verify phase of sequentially applying fifth to seventh verify voltages Vvfy5 to Vvfy7. L may be a natural number.

The program voltage Vpgm may be provided based on an incremental step pulse programming (ISPP) method. The program voltage Vpgm may be increased by a step voltage ΔV in each subsequent program loop. That is, the program voltage Vpgm may be sequentially increased from the first program voltage Vpgm1 in the first program loop to an L-th program voltage VpgmL in the L-th program loop.

The number of program states determines the number of verify voltages to be used. Referring to FIG. 4 by way of example, when the memory cell is a TLC, the number of program states is 7, and thus the number of verify voltages Vvfy1 to Vvfy7 may be 7. However, the present disclosure is not limited to TLC memory cells.

The program voltages Vpgm1 to VpgmL and the verify voltages Vvfy1 to Vvfy7 may be applied in program loops 1 to L, respectively, up to the maximum program loop MAX, which may be the L-th program loop.

Program states to be verified, that is, verify voltages to be applied in a verify phase in a specific program loop, may be preset based on experiment, a design, or the like in consideration of the number of erase and program operations before the corresponding product is shipped. Here, as the number of erase and program operations is increased, the speed at which the selected memory cells are programmed may be increased. Therefore, in consideration of the characteristics of the memory cells depending on an increase in the number of erase and program operations, which verify voltage is to be applied in the specific program loop may be set.

In the example of FIG. 4, verification for the first to third program states may be performed in each of program loops from a first program loop to a third program loop. That is, in the first to third program loops, the first to third verify voltages Vvfy1 to Vvfy3 may be respectively applied to a selected word line.

As described above, when a certain verify voltage to be applied in a specific program loop is preset, an unnecessary verify phase is added to a program operation and thus the time it takes to complete the program operation is increased, which may result in deterioration of the performance of the device (e.g., the storage device 1000 of FIG. 1).

Figure 5:
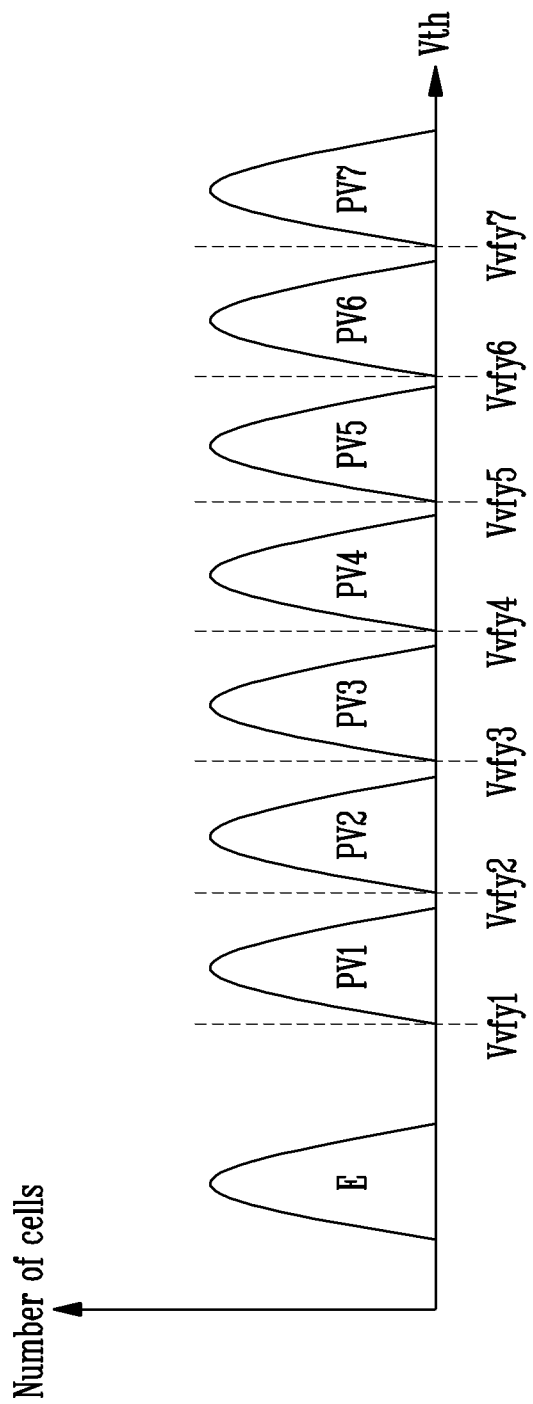
FIG. 5 is a diagram illustrating an erased state and a plurality of program states according to an embodiment of the present disclosure.

FIG. 5 is a diagram illustrating an erased state and a plurality of program states according to an embodiment of the present disclosure.

In the embodiment illustrated in FIG. 5, each of selected memory cells is assumed to be a TLC which stores three bits of data.

Referring to FIG. 5, a target state may be an erased state E or any one of a plurality of program states PV1 to PV7. The plurality of program states may include first to seventh program states PV1 to PV7, as illustrated in FIG. 5.

Each of memory cells may have a threshold voltage belonging to a threshold voltage distribution corresponding to an erased state or any one of the program states PV1 to PV7.

For example, before the program operation is performed, each memory cell may be in the erased state E. In an embodiment, the first program state PV1 may be the state of memory cells after an erase operation has been performed.

A program voltage Vpgm may be increased by a step voltage ΔV each time another program loop is performed. The threshold voltages Vth of the memory cells are increased depending on the program voltage Vpgm, and the threshold voltage distribution of the memory cells may be changed as the program voltage apply phase progresses. In detail, the threshold voltage distribution of the memory cells after the erase operation has been performed may be changed (or shifted) in a direction in which the threshold voltages Vth increase.

As the program voltage apply phase progresses, respective verify phases for the first to seventh program states PV1 to PV7 may be sequentially performed in the sequence of the first to seventh program states PV1 to PV7.

Verification for the first program state PV1 may include determining whether the threshold voltages of selected memory cells have reached a threshold voltage corresponding to the first program state PV1, that is, by applying a first verify voltage Vvfy1. Among the memory cells to be programmed to the first program state PV1, memory cells having threshold voltages Vth higher than the first verify voltage Vvfy1 may be in an off-state (or off-cells), and memory cells having threshold voltages Vth lower than or equal to the first verify voltage Vvfy1 may be in an on-state (or on-cells).

Verification for each of the second to seventh program states PV2 to PV7 may include determining whether the threshold voltages of selected memory cells have reached threshold voltages respectively corresponding to the second to seventh program states PV2 to PV7, that is, by applying second to seventh verify voltages Vvfy2 to Vvfy7, respectively.

Figure 6:
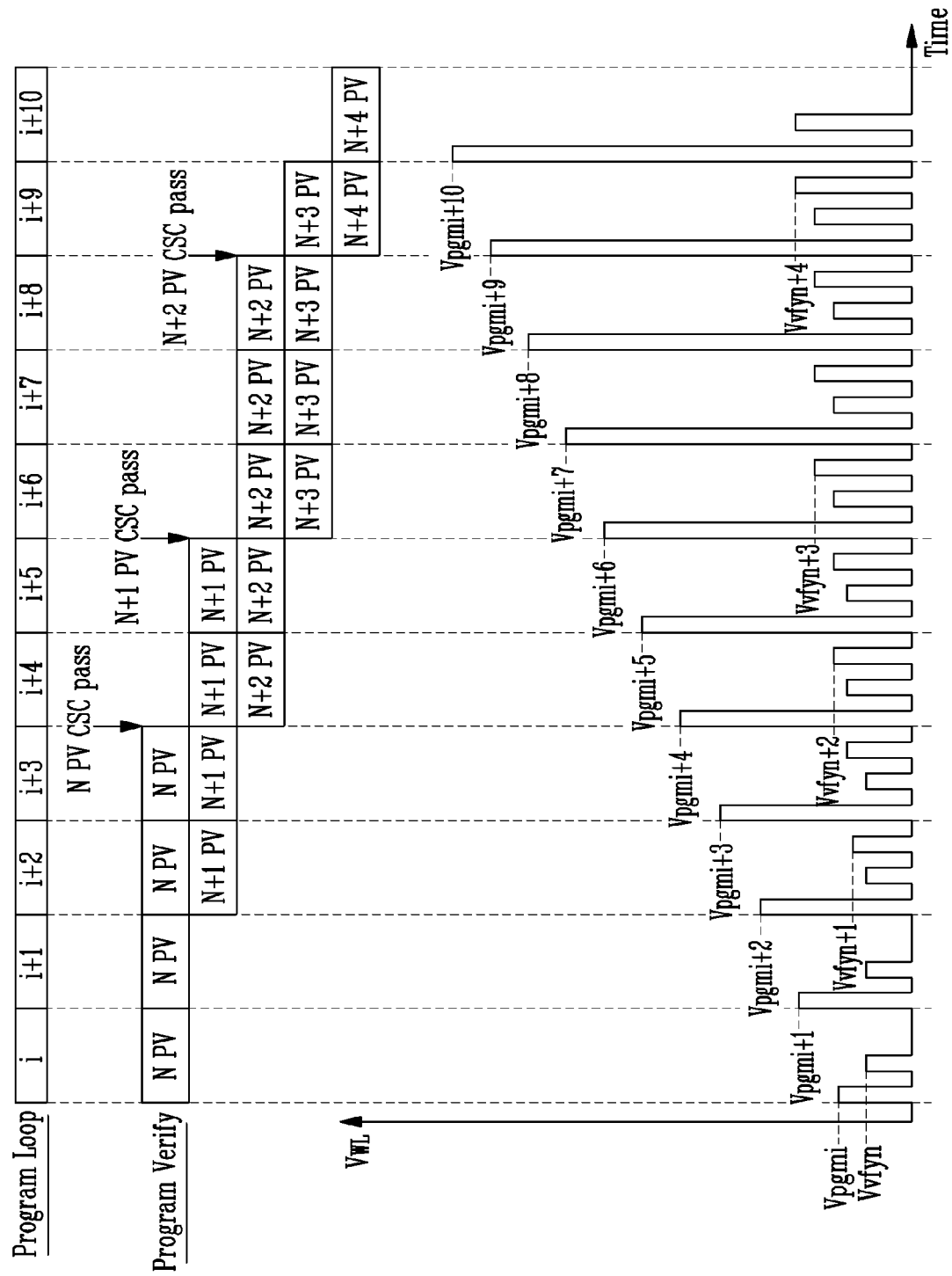
FIG. 6 is a diagram illustrating a program operation according to an embodiment of the present disclosure.

FIG. 6 is a diagram illustrating a program operation according to an embodiment of the present disclosure.

In the embodiment of FIG. 6, it is assumed that y in the x+y-th program loop, described above with reference to FIG. 1, is 1 and M in the N+M-th program state is 2. Further, it is assumed that voltage $V_{WL}$ applied to a selected word line is a program voltage Vpgm or a verify voltage Vvfyn.

Referring to FIG. 6, in an i-th program loop, an i-th program voltage apply phase for applying an i-th program voltage Vpgmi and a verify phase N PV for an N-th program state may be performed.

The verify phase N PV for the N-th program state may include applying an N-th verify voltage Vvfyn to a selected word line for verifying the N-th program state, and determining whether the number of memory cells detected to have threshold voltages higher than the N-th verify voltage Vvfyn, among the memory cells to be programmed to the N-th program state, is equal to or greater than a reference number of memory cells (reference number).

In an i+1-th program loop, an i+1-th program voltage apply phase for applying an i+1-th program voltage Vpgmi+1 and a verify phase N PV for an N-th program state may be performed. Here, the i+1-th program voltage Vpgmi+1 may be higher than the i-th program voltage Vpgmi by a step voltage (not illustrated).

In an i+2-th program loop, an i+2-th program voltage apply phase for applying an i+2-th program voltage Vpgmi+2, a verify phase N PV for an N-th program state, and a verify phase N+1 PV for an N+1-th program state may be performed.

The verify phase N+1 PV for the N+1-th program state may include applying an N+1-th verify voltage Vvfyn+1 to a selected word line for verifying the N+1-th program state, and determining whether the number of memory cells detected to have threshold voltages higher than the N+1-th verify voltage Vvfyn+1, among the memory cells to be programmed to the N+1-th program state, is equal to or greater than the reference number. A program loop in which the verify phase N+1 PV for the N+1-th program state is to be started may be determined based on experiment, design or the like, or may be set as described below with reference to FIG. 12, i.e., it may be determined that the verify phase N+1 PV for the N+1-th program state is to be started in a program loop subsequent to a program loop in which at least one memory cell having a threshold voltage higher than the N-th verify voltage Vvfyn is detected.

In an i+3-th program loop, an i+3-th program voltage apply phase for applying an i+3-th program voltage Vpgmi+3, a verify phase N PV for an N-th program state, and a verify phase N+1 PV for an N+1-th program state may be performed. In this case, in the verify phase N PV for the N-th program state, which is included in the i+3-th program loop, verification for the N-th program state may pass (N PV CSC PASS).

In an embodiment, a pass in verification for the N-th program state (N PV CSC PASS) may indicate that the number of memory cells detected to have threshold voltages higher than the N-th verify voltage Vvfyn, among the memory cells to be programmed to the N-th program state, is equal to or greater than the reference number.

In an embodiment, a pass in verification for the N-th program state (N PV CSC PASS) may indicate that the sensing currents of the memory cells to be programmed to the N-th program state are less than a reference current.

When verification for the N-th program state has passed (N PV CSC PASS), the verify phase N PV for the N-th program state need not be performed starting from an i+4-th program loop. Also, in an i+4-th program loop, a verify phase N+2 PV for an N+2-th program state may start.

In an i+5-th program loop, an i+5-th program voltage apply phase for applying an i+5-th program voltage Vpgmi+5, a verify phase N+1 PV for an N+1-th program state, and a verify phase N+2 PV for an N+2-th program state may be performed. In this case, in the verify phase N+1 PV for the N+1-th program state, which is included in the i+5-th program loop, verification for the N+1-th program state may pass (N+1 PV CSC PASS). When verification for the N+1-th program state has passed (N+1 PV CSC PASS), the verify phase N+3 PV for the N+3-th program state may start in an i+6-th program loop. The verify phase N+3 PV for the N+3-th program state may include applying an N+3-th verify voltage Vvfyn+3 for verifying the N+3-th program state to a selected word line, and determining whether the number of memory cells detected to have threshold voltages higher than the N+3-th verify voltage Vvfyn+3, among the memory cells to be programmed to the N+3-th program state, is equal to or greater than the reference number.

In an i+8-th program loop, an i+8-th program voltage apply phase for applying an i+8-th program voltage Vpgmi+8, a verify phase N+2 PV for an N+2-th program state, and a verify phase N+3 PV for an N+3-th program state may be performed. In this case, in the verify phase N+2 PV for the N+2-th program state, which is included in the i+8-th program loop, verification for the N+2-th program state may pass (N+2 PV CSC PASS). When verification for the N+2-th program state has passed (N+2 PV CSC PASS), the verify phase N+4 PV for the N+4-th program state may start in an i+9-th program loop. The verify phase N+4 PV for the N+4-th program state may include applying an N+4-th verify voltage Vvfyn+4 for verifying the N+4-th program state to a selected word line, and determining whether a number of memory cells having threshold voltages detected as higher than the N+4-th verify voltage Vvfyn+4, among the memory cells to be programmed to the N+4-th program state, is equal to or greater than the reference number.

According to the above description, depending on whether verification for a specific program state has passed, a start point at which a program state at a level higher than that of the specific program state is to be verified is determined. Therefore, there is an advantage in that the time it takes to perform a program operation may be reduced and the number of verify phases or computational overhead may be decreased, with the result that the performance of the storage device may be improved.

Figures 7, 8:
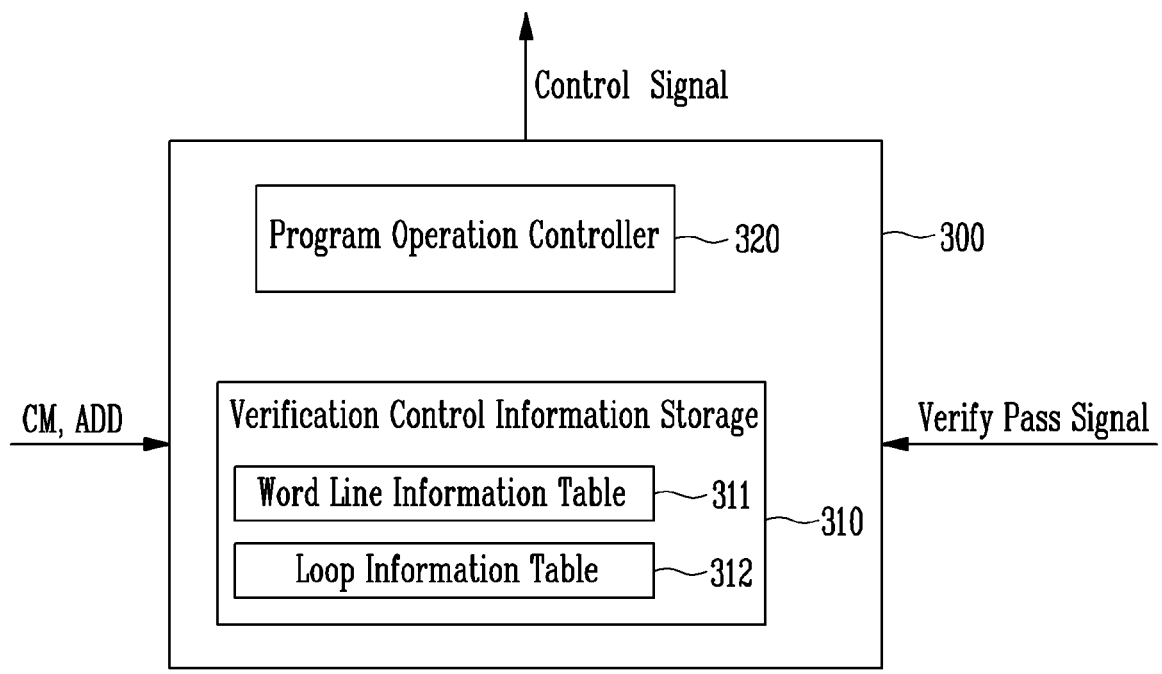
FIG. 7 is a diagram illustrating an operation controller according to an embodiment of the present disclosure.
FIG. 8 is a diagram illustrating a word line information table according to an embodiment of the present disclosure.

FIG. 7 is a diagram illustrating an operation controller according to an embodiment of the present disclosure.

Referring to FIG. 7, an operation controller 300 according to an embodiment of the present disclosure may be the operation controller 101 illustrated in FIGS. 1 and 2.

The operation controller 300 may output a control signal for controlling a program operation in response to a command CMD and an address ADD.

The command CMD and the address ADD may be provided from the input/output circuit 125 illustrated in FIG. 2. The command CMD may be a write command.

In an embodiment, the control signal may be the operation command OP_CMD provided to the voltage generator 121 illustrated in FIG. 2. The operation command OP_CMD may instruct the generation of a program voltage (e.g., Vpgmi illustrated in FIG. 6) or a verify voltage (e.g., Vvfyn illustrated in FIG. 6).

In an embodiment, the operation controller 300 may acquire information about a selected word line in response to the address ADD, and may determine the value of M in an N+M-th program state based on the selected word line information.

The selected word line information may be information about the location of the selected word line. A plurality of word lines may have different widths in a manufacturing process. Accordingly, respective features of the plurality of word lines, for example, internal resistance values, parasitic capacitances, etc., may change with the locations of the word lines. Accordingly, the voltage width of the threshold voltage distribution of memory cells coupled to respective word lines may also change. As the voltage width of a threshold voltage distribution is larger, the value of M in the N+M-th program operation may be increased.

After the control signal, for example, the operation command OP_CMD, has been output, the operation controller 300 may output a control signal for controlling a program operation in response to the command CMD, the address ADD, and a verify pass signal (Verify Pass Signal).

In an embodiment, the control signal may be the operation command OP_CMD provided to the voltage generator 121 illustrated in FIG. 2. The operation command OP_CMD may instruct the generation of a program voltage (e.g., Vpgmi+1 illustrated in FIG. 6) or a verify voltage (e.g., Vvfyn+1 illustrated in FIG. 6).

The verify pass signal may indicate whether verification for a specific program state has passed. The verify pass signal may be output from the sensing circuit 126 illustrated in FIG. 2.

In an embodiment, the verify pass signal may be a pass signal PASS or a fail signal FAIL, illustrated in FIG. 2. In detail, the verify pass signal may be a pass signal PASS indicating that verification for a specific program state has passed or a fail signal FAIL indicating that verification for a specific program state has failed.

In an embodiment, the verify pass signal may indicate information about the number of on-cells that are detected when a check voltage is applied to a selected word line. In this case, the operation controller 300 may determine the value of y in the x+y-th program loop based on the information about the number of on-cells.

As described above, due to the differences between the features of respective word lines, the voltage widths of the threshold voltage distributions of memory cells coupled to the plurality of word lines may change. As the voltage width of a threshold voltage distribution increases, the value of y may be become smaller. In this case, in a program loop iterated immediately after the program loop in which verification for the N-th program state has passed, verification for the N+M-th program state may start. According to this, a time at which verification for the N+M-th program state is to be started may be prevented from being delayed, and thus malfunctioning may be prevented from occurring. As the voltage width of a threshold voltage distribution decreases, the value of y may become larger. In this case, in a program loop after a set number of program loops from the program loop in which verification for the N-th program state has passed, verification for the N+M-th program state may start. According to this, the time for the program operation may be shortened by reducing the number of verify operations for the N+M-th program state.

For this, the operation controller 300 may include a verify control information storage 310 and a program operation controller 320.

In an embodiment, the verify control information storage 310 may include a word line information table 311.

The word line information table 311 may be a table including program state information depending on the locations of the plurality of word lines.

In an embodiment, the program state information may be information about a program state on which a verify phase is to start in an x+1-th program loop.

In an embodiment, the program state information may be information about the N+M-th program state. More specifically, the program state information may be information indicating the value of M in the N+M-th program state.

In an embodiment, the verify control information storage 310 may include a loop information table 312.

The loop information table 312 may include loop information depending on the number of memory cells (e.g., on-cells) having threshold voltages lower than a check voltage, among memory cells having an N-th program state as a target state.

The check voltage may be a voltage for detecting the threshold voltage distribution of the memory cells having the N-th program state as the target state.

The loop information may indicate information about one or more offset program loops. The offset program loop(s) may denote program loop(s) between the x+y-th program loop and an x-th program loop. For example, the number of the offset program loops may be represented by y.

In an embodiment, the program operation controller 320 may control the peripheral circuit 120 so that a program operation is performed based on information about the selected word line and the program state information. Here, the information about the selected word line may be acquired based on the address ADD, as described above.

In the embodiments of FIGS. 2 and 6, the program operation controller 320 may acquire program state information including information about the selected word line using the word line information table 311, determine the value of M in the N+M-th program state from the acquired program state information, and provide the voltage generator 121 with a control signal instructing the generation of the N+M-th verify voltage for verifying the N+M-th program state.

In an embodiment, the program operation controller 320 may control the peripheral circuit 120 so that the check voltage is generated in response to a pass in verification for the N-th program state. Further, the program operation controller 320 may control the peripheral circuit 120 so that a program operation is performed based on the loop information and number information about the number of memory cells (e.g., on-cells) having threshold voltages lower than the check voltage, among memory cells having the N-th program state as a target state. Here, the number information may be acquired based on the verify pass signal related to the check voltage, as described above. A detailed description thereof is given below with reference to FIGS. 10 and 11.

Figures 9, 10:
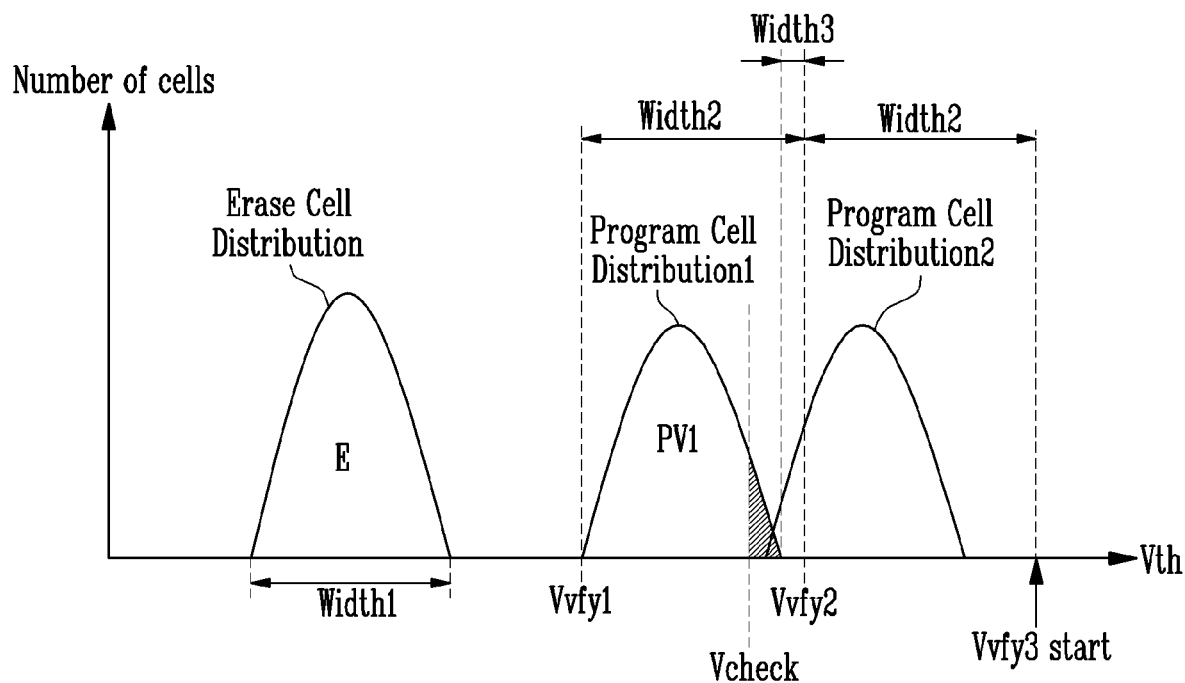
FIG. 9 is a diagram illustrating a word line information table according to an embodiment of the present disclosure.
FIG. 10 is a diagram illustrating a method of determining a program loop in which verification for an N+M-th program state is to be performed.

FIG. 8 is a diagram illustrating a word line information table according to an embodiment of the present disclosure, and FIG. 9 is a diagram illustrating a word line information table according to an embodiment of the present disclosure.

Referring to FIG. 8, a word line information table 311a according to an embodiment of the present disclosure may include program state information depending on word lines.

In an embodiment, when a number of the word line increases, a program speed corresponding to the word line may decrease. In this case, the value of M may be gradually increased. For example, the value of M may have a tendency to gradually increase in a direction from a first word line WL1 to an n-th word line WLn.

Referring to FIG. 9, a word line information table 311b according to an embodiment of the present disclosure may include program state information depending on word lines.

Respective features of the plurality of word lines may vary regardless of the locations of the word lines. For example, the program state information M of the first word line WL1, the second word line WL2, and the fourth word line WL4 may be 2, the program state information M of the third word line WL3 may be 3, and the program state information M of the fifth word line WL5 may be 4. However, the present disclosure is not limited thereto.

In an embodiment, the program operation controller 320 may determine the N+M-th program state using the information about the selected word line and the word line information table 311a or 311b, and may control the peripheral circuit 120 so that a verify voltage for verifying the determined N+M-th program state is applied.

More specifically, the program operation controller 320 may acquire the information about the selected word line in response to an address ADD, determine program state information, that is, M, based on the selected word line information from the word line information table 311a or 311b, and provide the voltage generator 121 with a control signal that instructs the generation of a verify voltage for verifying the N+M-th program state in which M has been determined.

Figures 11, 12:
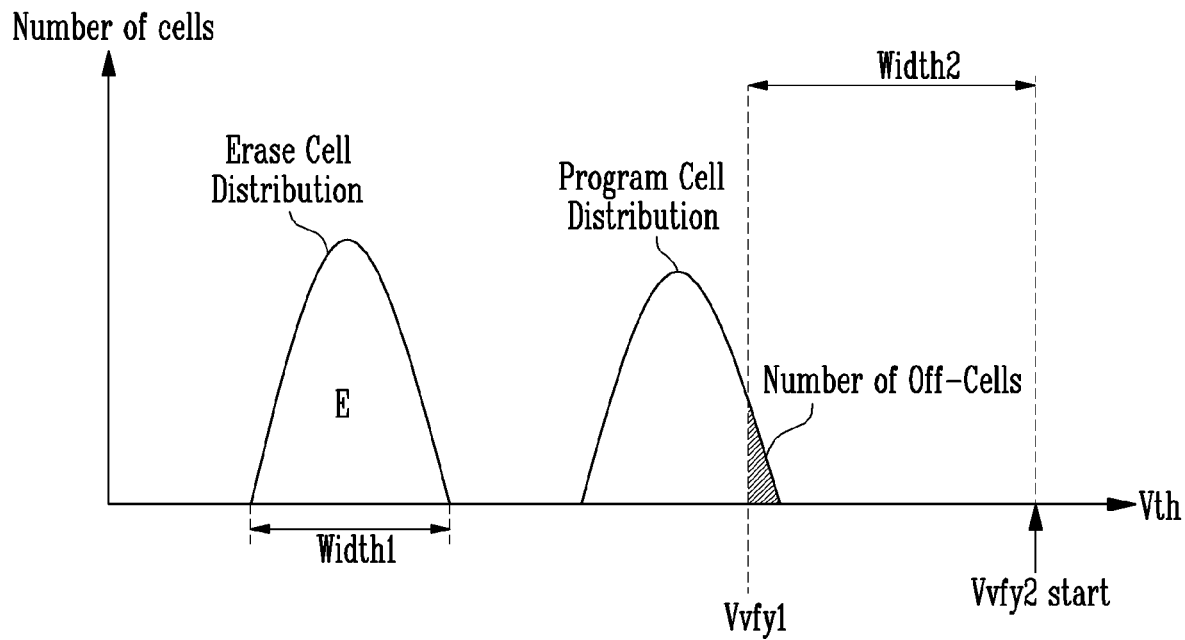
FIG. 11 is a diagram illustrating a loop information table according to an embodiment of the present disclosure.
FIG. 12 is a diagram illustrating verification for a second program state according to an embodiment of the present disclosure.

FIG. 10 is a diagram illustrating a method for determining a program loop in which verification for an N+M-th program state is to be performed, and FIG. 11 is a diagram illustrating a loop information table according to an embodiment of the present disclosure.

In the embodiments of FIGS. 10 and 11, it is assumed that N is 1 and M is 2.

Referring to FIG. 10, the threshold voltage distribution of memory cells after an erase operation has been performed (i.e., Erase Cell Distribution) may correspond to an erased state E1.

A first voltage width (Width1) of the threshold voltage distribution of memory cells after an erase operation has been performed (Erase Cell Distribution) may be preset, and may change with the location of a word line. A second voltage width Width2 between verify voltages Vvfy1 to Vvfy3 may be preset based on experiment, design, or the like.

As successive program loops are performed, the threshold voltage distribution of memory cells after an erase operation has been performed (Erase Cell Distribution) may be changed to a first program cell threshold voltage distribution (Program Cell Distribution1). The first program cell threshold voltage distribution (Program Cell Distribution1) may be greater than the first verify voltage Vvfy1 for verifying a first program state PV1. That is, the first program cell threshold voltage distribution (Program Cell Distribution1) may be a threshold voltage distribution at which verification for the first program state PV1 has passed. In this case, the number of memory cells having threshold voltages at a level higher than that of the first verify voltage Vvfy1, among the memory cells to be programmed to the first program state PV1, may be equal to or greater than the reference number. Alternatively, the sensing currents of the memory cells to be programmed to the first program state PV1 may be less than a reference current.

As successive program loops are performed, the threshold voltage distribution of memory cells after an erase operation has been performed (Erase Cell Distribution) may be changed to a second program cell threshold voltage distribution (Program Cell Distribution2).

In an embodiment, a third verify voltage Vvfy3 may start to be applied to a selected word line in an x+y-th program loop subsequent to the program loop in which the threshold voltage distribution of memory cells to be programmed to the first program state PV1 corresponds to the first program cell threshold voltage distribution (Program Cell Distribution1).

The value of y in the x+y-th program loop may be determined according to the third voltage width Width3 between the highest threshold voltage in the first program cell threshold voltage distribution (Program Cell Distribution1) and the second verify voltage Vvfy2. As the third voltage width Width3 is relatively large, a threshold voltage distribution such as the second program cell threshold voltage distribution (Program Cell Distribution2) close to the third verify voltage Vvfy3 may be formed only when the number of program loops performed is relatively large. As the third voltage width Width3 is relatively small, a threshold voltage distribution close to the third verify voltage Vvfy3 may be formed even if the number of program loops performed is relatively small.

The third voltage width Width3 may be measured as the number of memory cells (e.g., on-cells) having threshold voltages lower than a check voltage Vcheck, among memory cells having an N-th program state as a target state.

In order to detect the third voltage width Width3, the program operation controller 320 may control the peripheral circuit 120, for example, the voltage generator 121, so that the check voltage Vcheck is generated when verification for the first program state PV1 has passed. In the first program cell threshold voltage distribution (Program Cell Distribution1), the sensing currents of the memory cells having threshold voltages at a level lower than that of the check voltage Vcheck may be generated. The sensing currents may indicate the number information about the number of on-cells at the check voltage Vcheck. Furthermore, the sensing circuit 126 may provide a verify pass signal corresponding to the number information to the program operation controller 320.

In an embodiment, the level of the check voltage Vcheck may be higher than that of a verify voltage for verifying the N-th program state, and may be lower than that of a verify voltage for verifying the N+1-th program state.

In the embodiment of FIG. 10, the level of the check voltage Vcheck may be higher than that of the first verify voltage Vvfy1 for verifying the first program state, and may be lower than that of the second verify voltage Vvfy2 for verifying the second program state.

In an embodiment, the program operation controller 320 described with reference to FIG. 7 may acquire the number information in response to a verify pass signal related to the check voltage Vcheck, determine the value y of the x+y-th program loop corresponding to the number information using the loop information table 312, and control the peripheral circuit 120 so that a verify voltage for verifying an N+2-th program state is applied in a verify phase included in the determined x+y-th program loop.

Referring to FIG. 11, the loop information table 312 may include loop information (Offset Program Loop) depending on the number of on-cells at the check voltage Vcheck (Number of On-cell at Vcheck). The loop information (Offset Program Loop) may indicate the value of y of the x+y-th program loop.

For example, when the number of on-cells at the check voltage Vcheck is x1, the offset program loop y may be 1. When the number of on-cells at the check voltage Vcheck is x2 greater than x1, the offset program loops y may be 2. When the number of on-cells at the check voltage Vcheck is x3 greater than x2, the offset program loops y may be 3. However, the present disclosure is not limited thereto.

In accordance with the above description, there is an advantage in that the time it takes to perform a program operation may be shortened by minimizing a verify phase for a subsequent program state.

FIG. 12 is a diagram illustrating verification for a second program state according to an embodiment of the present disclosure.

Referring to FIG. 12, a threshold voltage distribution of memory cells after an erase operation has been performed (i.e., Erase Cell Distribution) may have a first voltage width Width1, and may correspond to an erased state E1.

The threshold voltage distribution of memory cells after the erase operation has been performed (Erase Cell Distribution) may be changed to a program cell threshold voltage distribution (Program Cell Distribution) by a program voltage Vpgm. For example, in a first program voltage apply phase in a first program loop, the threshold voltage distribution of memory cells after an erase operation has been performed (Erase Cell Distribution) may be changed to the program cell threshold voltage distribution (Program Cell Distribution).

In an embodiment, the operation controller 300 may control the peripheral circuit 120 so that verification for a first program state PV1 is performed in a verify phase in the first program loop. For example, the program operation controller 320 may control the voltage generator 121 so that a first verify voltage Vvfy1 for verifying the first program state PV1 is generated in the verify phase in the first program loop.

In the program cell threshold voltage distribution (Program Cell Distribution), memory cells having threshold voltages at a level higher than that of the first verify voltage Vvfy1 may be off-cells, and memory cells having threshold voltages at a level lower than that of the first verify voltage Vvfy1 may be on-cells, sensing currents of which may be generated.

In an embodiment, the operation controller 300 may control the peripheral circuit 120 so that verification for a second program state PV2 is performed in a program loop subsequent to a program loop in which a number of memory cells having threshold voltages detected as higher than that of the first verify voltage Vvfy1, among memory cells having the first program state PV1 as a target state, is equal to or greater than the reference number (i.e., Number of Off-Cells).

The first verify voltage Vvfy1 may be a voltage for verifying the first program state PV1. The second verify voltage Vvfy2 may be a voltage for verifying the second program state PV2.

The case where the number of memory cells detected to have threshold voltages higher than that of the first verify voltage Vvfy1 is equal to or greater than the reference number (i.e., Number of Off-Cells) may correspond to the case where the sensing currents of the above-described on-cells are generated.

Figure 13:
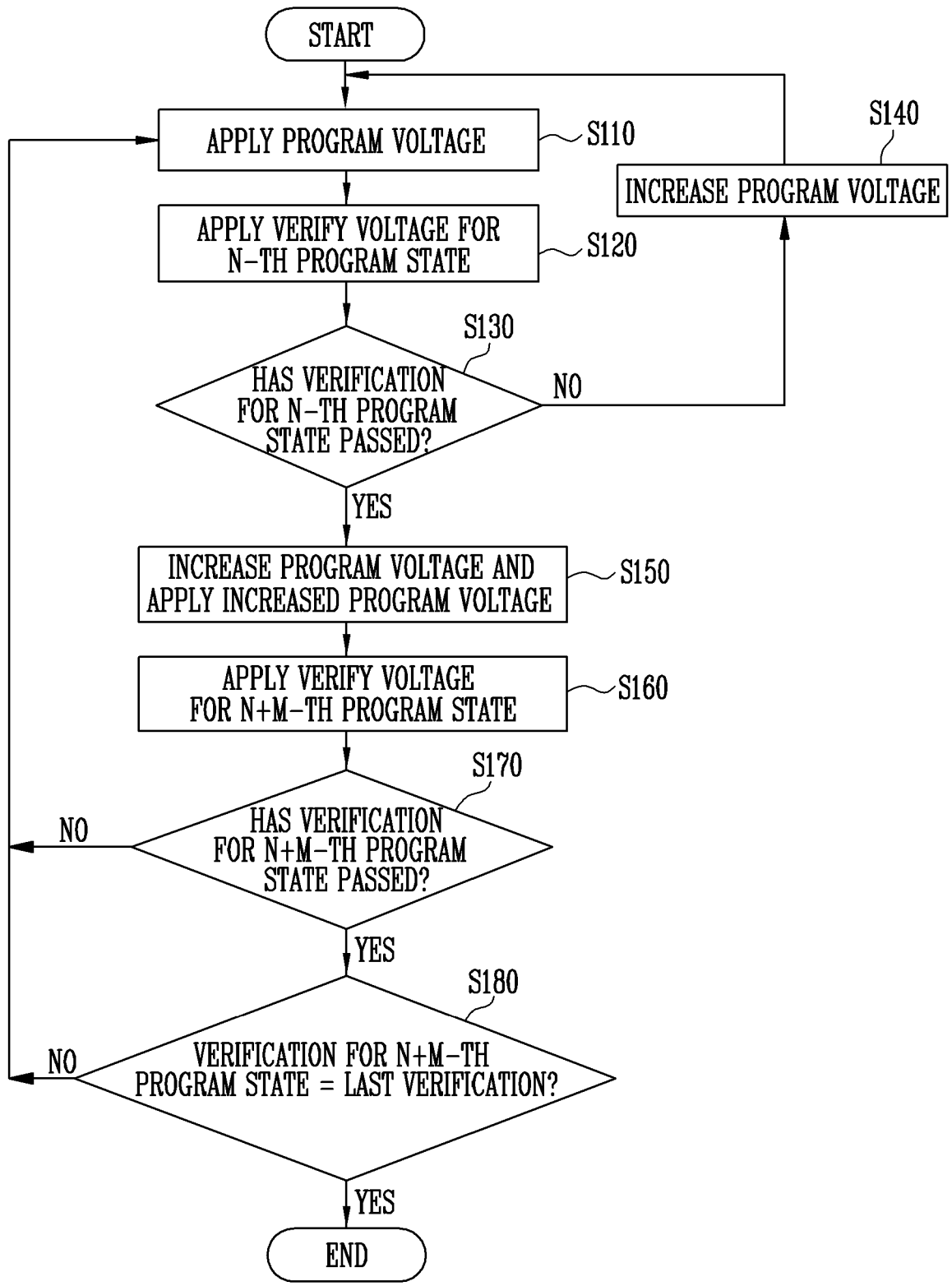
FIG. 13 is a flowchart illustrating a method of operating a memory device according to an embodiment of the present disclosure.

FIG. 13 is a flowchart illustrating a method of operating a memory device according to an embodiment of the present disclosure.

Referring to FIG. 13, the memory device 100 applies a program voltage to a selected word line coupled in common to a plurality of memory cells, among a plurality of word lines coupled to a memory block, in an x-th program loop at operation S110.

The memory device 100 verifies whether threshold voltages of memory cells to be programmed to an N-th program state, among the plurality of memory cells, have reached threshold voltages corresponding to an N-th program state in the x-th program loop. In detail, in the x-th program loop, after the program voltage apply operation S110, the memory device 100 applies a verify voltage for verifying the N-th program state to the selected word line at operation S120, and then determines whether verification for the N-th program state has passed at operation S130.

In operation S130, the memory device 100 senses respective sensing currents of the plurality of memory cells through a plurality of bit lines. The memory device 100 may determine whether verification for the N-th program state has passed based on whether each sensing current is less than a reference current, which may be preset.

When it is determined that verification for the N-th program state has failed (NO at operation S130), the memory device increases the program voltage at operation S140. The increment of the program voltage may correspond to a step voltage (not illustrated).

When verification for the N-th program state has passed (YES at operation S130), the memory device 100 applies a program voltage at a level higher than that of the program voltage applied in the x-th program loop at operation S150, and starts verification for an N+M-th program state in the x+y-th program loop. More specifically, the memory device may start verification for the N+M-th program state by applying a verify voltage for the N+M-th program state in the x+y-th program loop at operation S160.

In operation S160, the memory device 100 may receive information about the selected word line corresponding to an address, determine the N+M-th program state from program state information corresponding to the information about the selected word line using a word line information table, and apply a verify voltage for verifying the determined N+M-th program state.

The memory device 100 may determine whether verification for the N+M-th program state has passed in the x+y-th program loop at operation S170.

When verification for the N+M-th program state has passed (YES at operation S170), the memory device 100 determines whether verification for the N+M-th program state is the last verification at operation S180.

When verification for the N+M-th program state has failed (NO at operation S170), or when verification for the N+M-th program state is not the last verification (NO at operation S180), operation S110 is performed.

When verification for the N+M-th program state is the last verification (YES at operation S180), the process is terminated.

Figure 14:
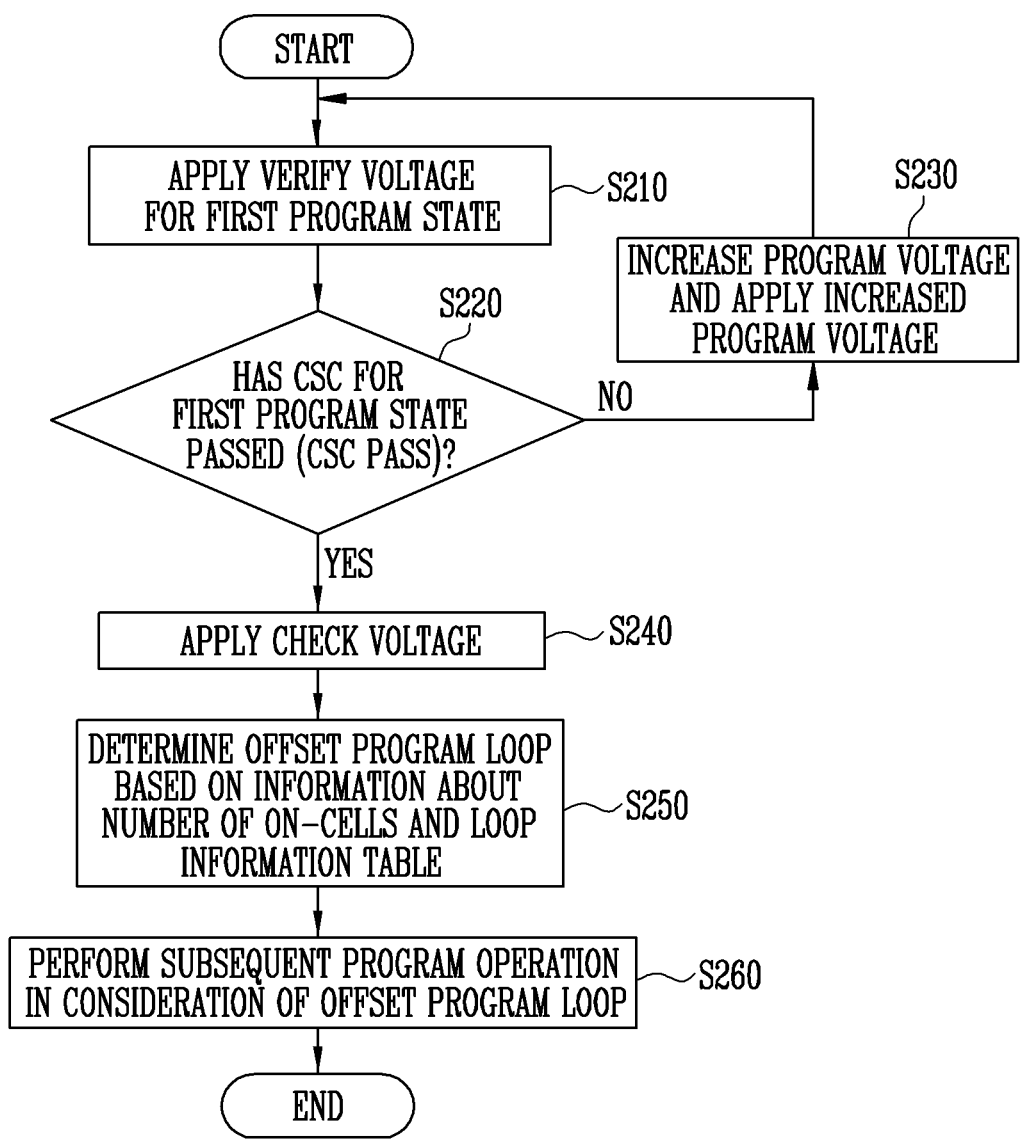
FIG. 14 is a flowchart illustrating a method of performing a subsequent program operation in consideration of an offset program loop according to an embodiment of the present disclosure.

FIG. 14 is a flowchart illustrating a method of performing a subsequent program operation in consideration of an offset program loop according to an embodiment of the present disclosure.

Referring to FIG. 14, the memory device 100 applies a verify voltage (e.g., a first verify voltage Vvfy1) for a first program state at operation S210, and determines whether a pass in current sensing circuit (CSC) for the first program state (CSC pass) has occurred at operation S220. Here, a pass in CSC for the first program state may denote an operation in which, when N is 1, as described above with reference to FIG. 6, verification for an N-th program state has passed (N PV CSC PASS).

When a pass in CSC for the first program state has not occurred (NO at operation S220), the memory device 100 increases the program voltage and applies the increased program voltage at operation S230.

When a pass in CSC for the first program state has occurred (YES at operation S220), the memory device 100 applies a check voltage for detecting the threshold voltage distribution of memory cells having the N-th program state as a target state. For example, the memory device 100 applies the check voltage in response to the pass in CSC for the first program state at operation S240.

The memory device 100 determines one or more offset program loops based on the number of on-cells and information in a loop information table at operation S250. Here, on-cells may denote memory cells having threshold voltages lower than the check voltage, among the memory cells having the N-th program state as the target state. For example, on-cells may be memory cells having threshold voltages at a level lower than that of the check voltage, among memory cells having a first program state as the target state.

In detail, the memory device 100 determines the value of y in an x+y-th program loop based on the loop information table and information about the number of on-cells.

The memory device 100 performs a subsequent program operation in consideration of the offset program loop(s) at operation S260. For example, the memory device 100 may perform a program operation in the x+y-th program loop in which the offset program loop(s) is/are taken into consideration.

Figure 15:
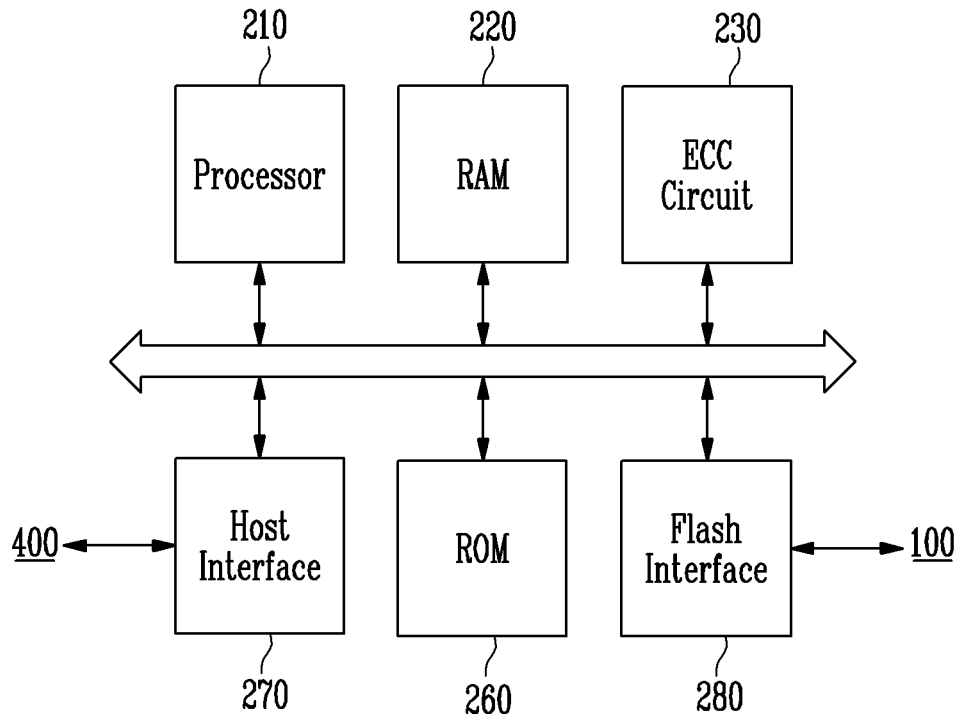
FIG. 15 is a diagram illustrating a memory controller according to an embodiment of the present disclosure.

FIG. 15 is a diagram illustrating a memory controller according to an embodiment of the present disclosure.

Referring to FIGS. 1 and 15, the memory controller 200 may include a processor 210, a RAM 220, an error correction circuit 230, a ROM 260, a host interface 270, and a flash interface 280.

The processor 210 may control overall operation of the memory controller 200.

The RAM 220 may be used as a buffer memory, a cache memory, or a working memory for the memory controller 200. In an example, the buffer memory may be the RAM 220, and may be, for example, an SRAM.

The ROM 260 may store various types of information used for the operation of the memory controller 200 in the form of firmware.

The memory controller 200 may communicate with an external device (e.g., the host 400, an application processor or the like) through the host interface 270.

The memory controller 200 may communicate with the memory device 100 through the flash interface 280. The memory controller 200 may transmit a command, an address, a control signal, etc. to the memory device 100 and receive data from the memory device 100, through the flash interface 280.

The flash interface 280 may include, for example, a NAND interface.

Figure 16:
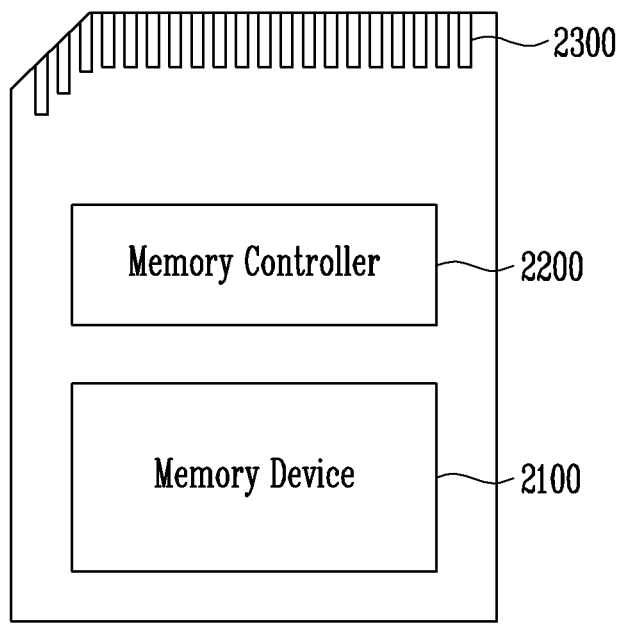
FIG. 16 is a diagram illustrating a memory card system to which a storage device is applied according to an embodiment of the present disclosure.

FIG. 16 is a diagram illustrating a memory card system to which a storage device is applied according to an embodiment of the present disclosure.

Referring to FIGS. 1 and 16, a memory card system 2000 may include a memory device 2100, a memory controller 2200, and a connector 2300.

In an embodiment, the memory device 2100 may be implemented as any of various nonvolatile memory devices, such as an electrically erasable and programmable ROM (EEPROM), a NAND flash memory, a NOR flash memory, a phase-change RAM (PRAM), a resistive RAM (ReRAM), a ferroelectric RAM (FRAM), and/or a spin-transfer torque magnetic RAM (STT-MRAM).

The memory controller 2200 is coupled to the memory device 2100.

The memory controller 2200 may access the memory device 2100. For example, the memory controller 2200 may control read, write, erase, and background operations of the memory device 2100. The memory controller 2200 may provide an interface between the memory device 2100 and a host 400. The memory controller 2200 may run firmware for controlling the memory device 2100. The memory controller 2200 may be implemented in the same manner as the memory controller 200 of FIG. 1.

In an embodiment, the memory controller 2200 may include components, such as a RAM, a processor, a host interface, a memory interface, and an error correction circuit.

The memory controller 2200 may communicate with an external device through the connector 2300. The memory controller 2200 may communicate with an external device (e.g., the host 400) based on a specific communication protocol. In an embodiment, the memory controller 2200 may communicate with the external device through at least one of various interface protocols such as universal serial bus (USB), multimedia card (MMC), embedded MMC (eMMC), peripheral component interconnect (PCI), PCI-express (PCI-E), an advanced technology attachment (ATA) protocol, a serial-ATA (SATA), parallel-ATA (PATA), small computer system interface (SCSI), enhanced small disk interface (ESDI), integrated drive electronics (IDE), firewire, universal flash storage (UFS), WiFi, Bluetooth, and/or nonvolatile memory express (NVMe) protocols. In an embodiment, the connector 2300 may be defined by at least one of the above-described various communication protocols.

The memory device 2100 and the memory controller 2200 may be integrated into a single semiconductor device to form a memory card, such as a personal computer memory card international association (PCMCIA), a compact flash card (CF), a smart media card (SM or SMC), a memory stick multimedia card (MMC, RS-MMC, MMCmicro or eMMC), a SD card (SD, miniSD, microSD, or SDHC), a universal flash storage (UFS), or the like.

Figure 17:
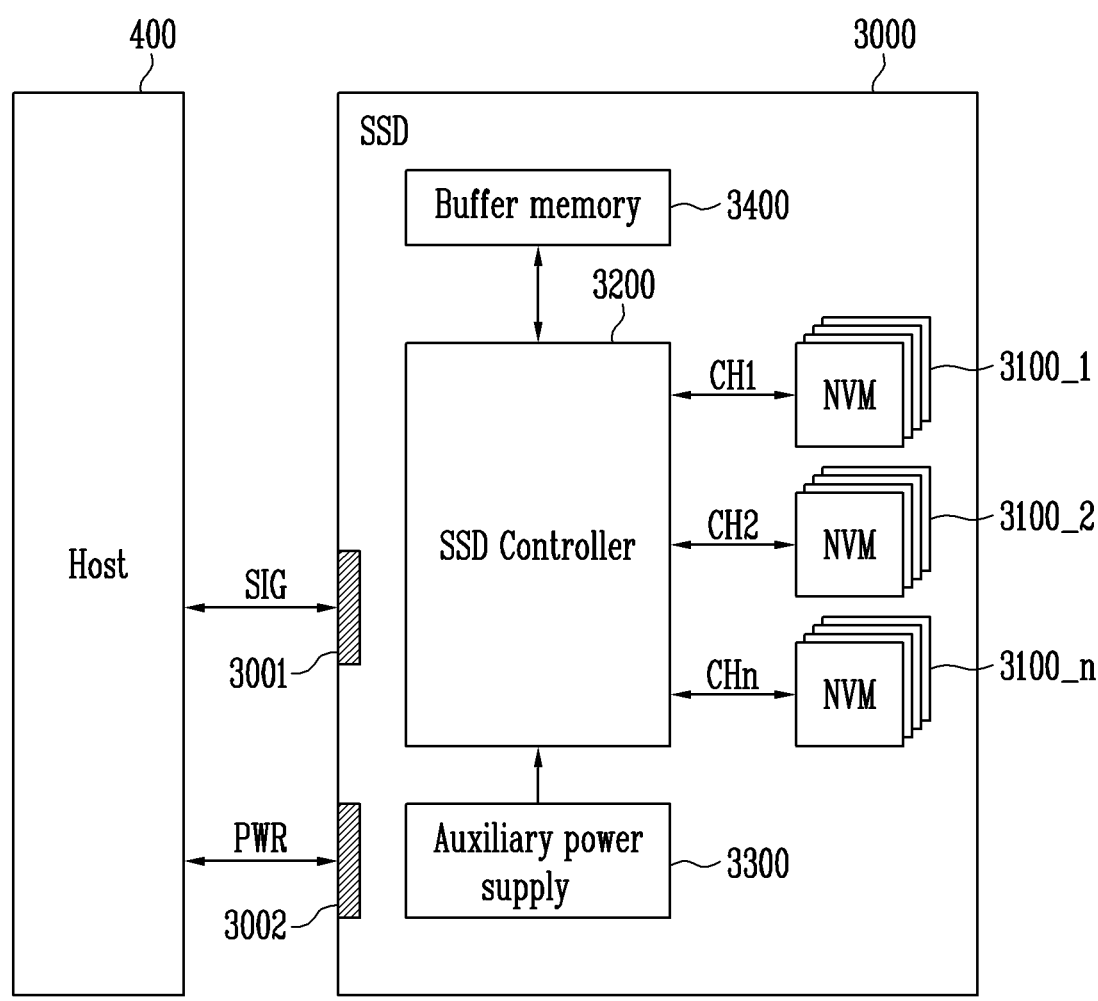
FIG. 17 is a diagram illustrating a solid state drive (SSD) system to which a storage device is applied according to an embodiment of the present disclosure.

FIG. 17 is a diagram illustrating a solid state drive (SSD) system to which a storage device is applied according to an embodiment of the present disclosure.

Referring to FIGS. 1 and 17, the SSD system may include a host 400 and an SSD 3000.

The SSD 3000 may exchange a signal SIG with the host 400 through a signal connector 3001, and may receive power PWR through a power connector 3002. The SSD 3000 may include an SSD controller 3200, a plurality of flash memories 3100_1, 3100_2, and 3100_n, an auxiliary power supply 3300, and a buffer memory 3400.

In accordance with an embodiment of the present disclosure, the SSD controller 3200 may perform the function of the memory controller 200 of FIG. 1.

The SSD controller 3200 may control the plurality of flash memories 3100_1, 3100_2, and 3100_n in response to the signal SIG received from the host 400. In an embodiment, the signal SIG may indicate signals based on the interfaces of the host 400 and the SSD 3000. For example, the signal SIG may be a signal defined by at least one of various interfaces such as universal serial bus (USB), multimedia card (MMC), embedded MMC (eMMC), peripheral component interconnect (PCI), PCI-express (PCI-E), an advanced technology attachment (ATA), serial-ATA (SATA), parallel-ATA (PATA), small computer system interface (SCSI), enhanced small disk interface (ESDI), integrated drive electronics (IDE), firewire, universal flash storage (UFS), WiFi, Bluetooth, and/or nonvolatile memory express (NVMe) interfaces.

The auxiliary power supply 3300 may be coupled to the host 400 through the power connector 3002. The auxiliary power supply 3300 may be supplied with power PWR from the host 400, and may be charged. The auxiliary power supply 3300 may supply the power of the SSD 3000 when the supply of power from the host 400 is not smoothly supplied. In an embodiment, the auxiliary power supply 3300 may be disposed in, or externally to, the SSD 3000. For example, the auxiliary power supply 3300 may be disposed on a main board, and may also provide auxiliary power to the SSD 3000.

The buffer memory 3400 may temporarily store data. For example, the buffer memory 3400 may temporarily store data received from the host 400 or data received from the plurality of flash memories 3100_1, 3100_2, and 3100_n, or may temporarily store metadata (e.g., mapping tables) of the flash memories 3100_1, 3100_2, and 3100_n. The buffer memory 3400 may include volatile memories, such as DRAM, SDRAM, DDR SDRAM, LPDDR SDRAM, and GRAM, or nonvolatile memories, such as FRAM, ReRAM, STT-MRAM, and PRAM.

Figure 18:
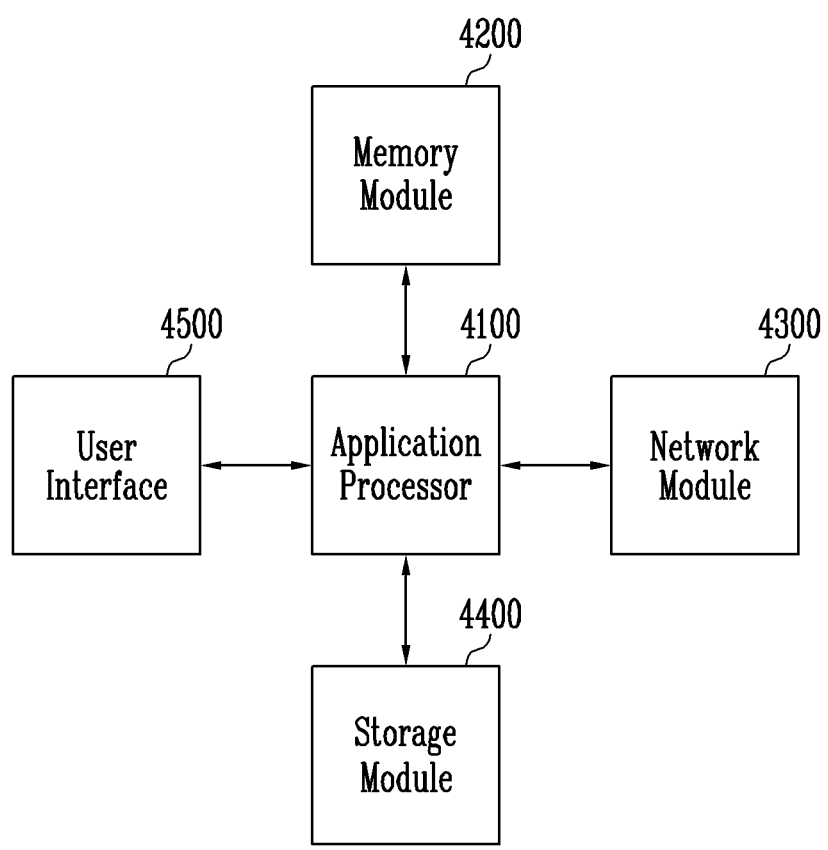
FIG. 18 is a diagram illustrating a user system to which a storage device is applied according to an embodiment of the present disclosure.

FIG. 18 is a diagram illustrating a user system to which a storage device is applied according to an embodiment of the present disclosure.

Referring to FIG. 18, a user system 4000 may include an application processor 4100, a memory module 4200, a network module 4300, a storage module 4400, and a user interface 4500.

The application processor 4100 may run components included in the user system 4000, an operating system (OS) or a user program. In an embodiment, the application processor 4100 may include controllers, interfaces, graphic engines, etc. for controlling the components included in the user system 4000. The application processor 4100 may be provided in the form of a system-on-chip (SoC).

The memory module 4200 may function as a main memory, a working memory, a buffer memory or a cache memory of the user system 4000. The memory module 4200 may include volatile RAMs such as DRAM, SDRAM, DDR SDRAM, DDR2 SDRAM, DDR3 SDRAM, LPDDR SDARM, LPDDR2 SDRAM, and LPDDR3 SDRAM or nonvolatile RAMs such as PRAM, ReRAM, MRAM, and FRAM. In an embodiment, the application processor 4100 and the memory module 4200 may be packaged based on a package-on-package (POP), and may then be provided as a single semiconductor package.

The network module 4300 may communicate with external devices. In an embodiment, the network module 4300 may support wireless communication, such as code division multiple access (CDMA), global system for mobile communication (GSM), wideband CDMA (WCDMA), CDMA-2000, time division multiple access (TDMA), long term evolution (LTE), Wimax, WLAN, UWB, Bluetooth, or WiFi. In an embodiment, the network module 4300 may be included in the application processor 4100.

The storage module 4400 may store data. For example, the storage module 4400 may store data received from the application processor 4100. Alternatively, the storage module 4400 may transmit the data stored in the storage module 4400 to the application processor 4100. In an embodiment, the storage module 4400 may be implemented as a nonvolatile semiconductor memory device, such as a phase-change RAM (PRAM), a magnetic RAM (MRAM), a resistive RAM (RRAM), a NAND flash memory, a NOR flash memory, or a NAND flash memory having a 3D structure. In an embodiment, the storage module 4400 may be provided as a removable storage medium (removable drive), such as a memory card or an external drive of the user system 4000.

In an example, the storage module 4400 may be operated in the same manner as the storage device 1000 of FIG. 1. The storage module 4400 may include a plurality of nonvolatile memory devices, each of which may be operated in the same manner as the memory device 100 of FIG. 1.

The user interface 4500 may include interfaces which input data or instructions to the application processor 4100 or output data to an external device. In an embodiment, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric element. The user interface 4500 may further include user output interfaces such as an a liquid crystal display (LCD), an organic light-emitting diode (OLED) display device, an active matrix OLED (AMOLED) display device, an LED, a speaker, and a monitor.

As described above, in accordance with embodiments of the present disclosure, there is an advantage in that device performance may be improved by reducing the time it takes to perform a program operation.

In accordance with the present disclosure, there are provided a memory device that improves device performance by reducing program operation time, and a method of operating the memory device.

While the present invention has been illustrated and described in the context of various embodiments, those skilled in the art will recognize that various modifications may be made within the spirit and scope of the invention. The present invention encompasses all such modifications that fall within the scope of the claims.

What is claimed is:

1. A memory device, comprising:
   a memory block including a plurality of memory cells, each having an erased state or any one of a plurality of program states including first to p-th program states as a target state, where p is a natural number greater than 1;
   a peripheral circuit configured to perform a program operation including a plurality of program loops, each of which includes a program voltage apply phase and a verify phase, wherein the program voltage apply phase is configured to apply a program voltage to a selected word line coupled in common to the plurality of memory cells among a plurality of word lines coupled to the memory block, and the verify phase is configured to determine whether each of threshold voltages of the plurality of memory cells has reached a threshold voltage corresponding to the target state; and
   an operation controller configured to control the peripheral circuit so that, in response to a pass in verification for an N-th program state among the plurality of program states in the verify phase in an x-th program loop among the plurality of program loops, verification for an N+M-th program state among the plurality of program states starts in the verify phase in an x+1-th program loop among the plurality of program loops, where x is a natural number, N is a natural number that is equal to or greater than 1 and less than or equal to p−2, and M is a natural number equal to or greater than 2.

2. The memory device according to claim 1, wherein the operation controller is configured to control the peripheral circuit so that verification for a first program state among the plurality of program states is performed in the verify phase in a first program loop among the plurality of program loops.

3. The memory device according to claim 2, wherein the operation controller is configured to control the peripheral circuit so that verification for a second program state starts in a program loop subsequent to a program loop in which a number of memory cells having threshold voltages detected as higher than a verify voltage for verifying the first program state, among memory cells having the first program state as a target state, is equal to or greater than a reference number.

4. The memory device according to claim 1, wherein the operation controller comprises:
   a verify control information storage configured to store a word line information table including program state information about a program state on which the verify phase is to start in the x+1-th program loop depending on locations of the plurality of word lines; and
   a program operation controller configured to control the peripheral circuit so that the program operation is performed based on the selected word line and the word line information table.

5. The memory device according to claim 4, wherein the program operation controller controls the peripheral circuit to:
   determine the N+M-th program state based on the selected word line and the word line information table, so that a verify voltage for verifying the determined N+M-th program state is applied.

6. The memory device according to claim 1, wherein the peripheral circuit comprises:
   a voltage generator configured to generate the program voltage in the program voltage apply phase and generate a verify voltage in the verify phase;

a page buffer group configured to provide write data to the plurality of memory cells through a plurality of bit lines in the program voltage apply phase and to sense whether respective threshold voltages of the plurality of memory cells are greater than the verify voltage through the plurality of bit lines in the verify phase; and a sensing circuit configured to determine whether verification for each of the plurality of program states has passed, based on a reference current and a sensing current corresponding to a number of memory cells having threshold voltages greater than the verify voltage, and to output a pass signal or a fail signal depending on a result of the determination.

7. A memory device, comprising:

a memory block including a plurality of memory cells, each having an erased state or any one of a plurality of program states including first to p-th program states as a target state, where p is a natural number greater than 1;

a peripheral circuit configured to perform a program operation including a plurality of program loops, each of which includes a program voltage apply phase and a verify phase, wherein the program voltage apply phase is configured to apply a program voltage to a selected word line coupled in common to the plurality of memory cells, among a plurality of word lines coupled to the memory block, and the verify phase is configured to determine whether each of threshold voltages of the plurality of memory cells has reached a threshold voltage corresponding to the target state; and an operation controller configured to control the peripheral circuit so that, in response to a pass in verification for an N-th program state among the plurality of program states in the verify phase included in an x-th program loop among the plurality of program loops, verification for an N+2-th program state among the plurality of program states starts in the verify phase included in an x+y-th program loop among the plurality of program loops, where x is a natural number, N is a natural number that is equal to or greater than 1 and less than or equal to p−2, and y is a natural number equal to or greater than 1.

8. The memory device according to claim 7, wherein the operation controller is configured to control the peripheral circuit so that verification for a first program state among the plurality of program states is performed in the verify phase included in a first program loop among the plurality of program loops.

9. The memory device according to claim 8, wherein the operation controller is configured to control the peripheral circuit so that verification for a second program state starts in a program loop subsequent to a program loop in which a number of memory cells having threshold voltages detected as higher than a verify voltage for verifying the first program state, among memory cells having the first program state as a target state, is equal to or greater than a reference number.

10. The memory device according to claim 7, wherein the operation controller comprises:

a verify control information storage configured to store a loop information table including loop information about one or more offset program loops between the x+y-th program loop and the x-th program loop, the number of offset program loops depending on a number of memory cells having threshold voltages lower than a check voltage among the memory cells having the N-th program state as the target state; and a program operation controller configured to control the peripheral circuit, in response to the pass in verification for the N-th program state, so that the check voltage for detecting a threshold voltage distribution of the memory cells having the N-th program state as the target state is generated, and the program operation is performed based on the loop information table and number information about the number of memory cells having threshold voltages lower than the check voltage, among the memory cells having the N-th program state as the target state.

11. The memory device according to claim 10, wherein the check voltage is higher than a verify voltage for verifying the N-th program state and lower than a verify voltage for verifying an N+1-th program state.

12. The memory device according to claim 10, wherein the program operation controller controls the peripheral circuit to:

determine the x+y-th program loop based on the number information and the loop information table, so that a verify voltage for verifying the N+2-th program state is applied in the verify phase included in the determined x+y-th program loop.

13. The memory device according to claim 7, wherein the peripheral circuit comprises:

a voltage generator configured to generate the program voltage in the program voltage apply phase and generate a verify voltage in the verify phase;

a page buffer group configured to provide write data to the plurality of memory cells through a plurality of bit lines in the program voltage apply phase and to sense sensing currents corresponding to respective threshold voltages of the plurality of memory cells through the plurality of bit lines in the verify phase; and a sensing circuit configured to determine whether verification for each of the plurality of program states has passed, based on the sensing currents and a reference current, and to output a pass signal or a fail signal depending on a result of the determination.

14. A method of operating a memory device for programming each of a plurality of memory cells to an erased state or any one of a plurality of program states including first to p-th program states as a target state, where p is a natural number greater than 1, the method comprising:

applying, in an x-th program loop, a program voltage to a selected word line coupled in common to the plurality of memory cells among a plurality of word lines, where x is a natural number;

verifying, in the x-th program loop, whether each of threshold voltages of memory cells to be programmed to an N-th program state, among the plurality of memory cells, has reached a threshold voltage corresponding to the N-th program state, where N is a natural number that is equal to or greater than 1 and less than or equal to p−2;

applying, in an x+y-th program loop, a program voltage higher than the program voltage applied in the x-th program loop, where y is a natural number equal to or greater than 1; and starting, in the x+y-th program loop, verification for an N+M program state in response to a pass in verification for the N-th program state, where M is a natural number equal to or greater than 2.

15. The method according to claim 14, wherein verifying in the x-th program loop comprises:

applying, after the program voltage has been applied, a verify voltage for verifying the N-th program state to the selected word line;

sensing respective sensing currents of the plurality of memory cells through a plurality of bit lines; and determining, based on whether each of the sensing currents is less than a reference current, whether verification for the N-th program state has passed.

16. The method according to claim 14, wherein starting verification for the N+M-th program state comprises:

receiving information about a location of the selected word line;

determining the N+M-th program state corresponding to the selected word line based on the location information and a word line information table that includes program state information about the N+M-th program state depending on locations of the plurality of word lines; and applying a verify voltage for verifying the determined N+M-th program state.

17. The method according to claim 14, wherein verifying in the x-th program loop comprises: verifying whether each of threshold voltages of memory cells to be programmed to a first program state, among the plurality of memory cells, has reached a threshold voltage corresponding to the first program state, wherein starting in the x+y-th program loop includes starting, in an x+1-th program loop, verification for a second program state in response to sensing that, in the x-th program loop, a number of memory cells having threshold voltages detected as higher than a verify voltage for verifying the first program state, among the memory cells to be programmed to the first program state, is equal to or greater than a reference number.

18. The method according to claim 14, further comprising:

applying, in the x-th program loop, a check voltage for detecting a threshold voltage distribution of memory cells having the N-th program state as the target state in response to the pass in verification for the N-th program state; and determining, in the x-th program loop the x+y-th program loop based on a loop information table and number information about a number of memory cells having threshold voltages lower than the check voltage among the memory cells having the N-th program state as the target state, wherein the loop information table includes loop information about one or more offset program loops between the x+y-th program loop and the x-th program loop, the number of offset program loops depending on the number of memory cells having threshold voltages lower than the check voltage, among the memory cells having the N-th program state as the target state.

* * * * *